United States Patent
Heo et al.

(10) Patent No.: US 9,263,255 B2
(45) Date of Patent: Feb. 16, 2016

(54) METHOD FOR SEPARATING EPITAXIAL LAYERS FROM GROWTH SUBSTRATES, AND SEMICONDUCTOR DEVICE USING SAME

(71) Applicant: Seoul Viosys Co., Ltd., Ansan-si (KR)

(72) Inventors: Jeong Hun Heo, Ansan-si (KR); Joo Won Choi, Ansan-si (KR); Choong Min Lee, Ansan-si (KR); Su Jin Shin, Ansan-si (KR); Ki Bum Nam, Ansan-si (KR); Yu Dae Han, Ansan-si (KR); A Ram Cha Lee, Ansan-si (KR)

(73) Assignee: SEOUL VIOSYS CO., LTD., Ansan-Si (KR)

( * ) Notice: Subject to any disclaimer, the term of this patent is extended or adjusted under 35 U.S.C. 154(b) by 0 days.

(21) Appl. No.: 14/386,775

(22) PCT Filed: Mar. 19, 2013

(86) PCT No.: PCT/KR2013/002227
§ 371 (c)(1),
(2) Date: Sep. 19, 2014

(87) PCT Pub. No.: WO2013/141561
PCT Pub. Date: Sep. 26, 2013

(65) Prior Publication Data
US 2015/0069418 A1 Mar. 12, 2015

(30) Foreign Application Priority Data

Mar. 19, 2012 (KR) .......................... 10-2012-0027561
Apr. 3, 2012 (KR) .......................... 10-2012-0034341
Jul. 17, 2012 (KR) .......................... 10-2012-0077658

(51) Int. Cl.
*H01L 33/00* (2010.01)
*H01L 21/02* (2006.01)
(Continued)

(52) U.S. Cl.
CPC ...... *H01L 21/02494* (2013.01); *H01L 21/0243* (2013.01); *H01L 21/0254* (2013.01); *H01L 21/02488* (2013.01); *H01L 21/02664* (2013.01); *H01L 29/0657* (2013.01); *H01L 33/0075* (2013.01); *H01L 33/0079* (2013.01);
(Continued)

(58) Field of Classification Search
CPC ..................... H01L 21/02494; H01L 29/0657; H01L 33/0079; H01L 33/30
USPC .......................................................... 257/79
See application file for complete search history.

(56) References Cited

U.S. PATENT DOCUMENTS

2008/0197359 A1* 8/2008 Imanishi et al. ............... 257/76
2010/0112308 A1* 5/2010 Russell et al. ............. 428/195.1
(Continued)

FOREIGN PATENT DOCUMENTS

JP 2006196543 A 7/2006
JP 2007243090 A 9/2007
(Continued)

*Primary Examiner* — Nathan Ha
(74) *Attorney, Agent, or Firm* — Perkins Coie LLP

(57) ABSTRACT

The present invention relates to a method for separating epitaxial layers and growth substrates, and to a semiconductor device using same. According to the present invention, a semiconductor device is provided which comprises a supporting substrate and a plurality of semiconductor layers provided on the supporting substrate, wherein the uppermost layer of the semiconductor layers has a surface of non-uniform roughness.

30 Claims, 20 Drawing Sheets

(51) Int. Cl.
  *H01L 33/20* (2010.01)
  *H01L 29/06* (2006.01)
  *H01L 33/22* (2010.01)
  *H01L 33/02* (2010.01)

(52) U.S. Cl.
  CPC ............ *H01L33/20* (2013.01); *H01L 33/0095* (2013.01); *H01L 33/025* (2013.01); *H01L 33/22* (2013.01)

(56) References Cited

U.S. PATENT DOCUMENTS

| | | | |
|---|---|---|---|
| 2011/0201184 A1* | 8/2011 | Motoki et al. | 438/492 |
| 2011/0240997 A1* | 10/2011 | Rockenberger et al. | 257/49 |
| 2012/0021173 A1* | 1/2012 | Shimada | 428/137 |
| 2012/0112165 A1* | 5/2012 | Charlton et al. | 257/21 |
| 2012/0326165 A1* | 12/2012 | Nakata et al. | 257/77 |
| 2013/0168688 A1* | 7/2013 | Lee et al. | 257/76 |
| 2013/0210203 A1* | 8/2013 | Imanishi et al. | 438/172 |

FOREIGN PATENT DOCUMENTS

| | | |
|---|---|---|
| JP | 2007266472 A | 10/2007 |
| JP | 2011192752 A | 9/2011 |
| JP | 2011192899 A | 9/2011 |

\* cited by examiner

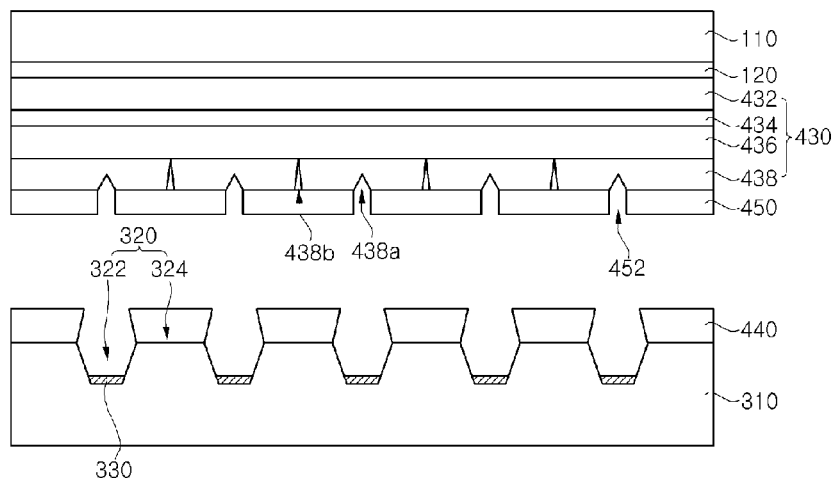
FIG 24
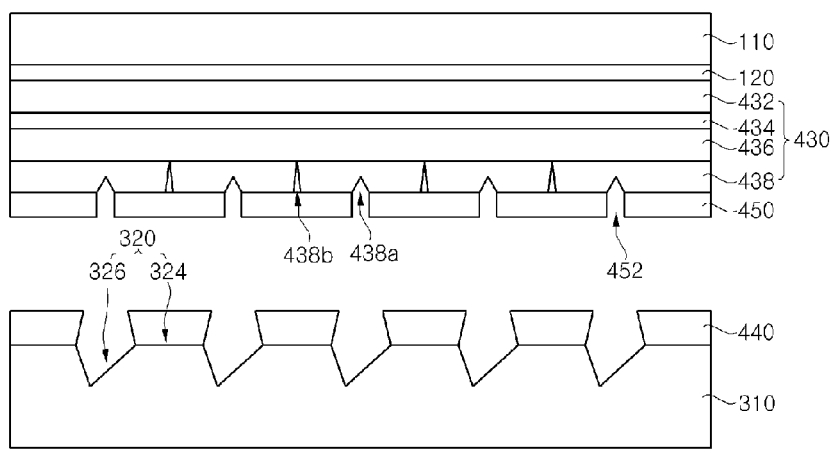
FIG 25
FIG 26
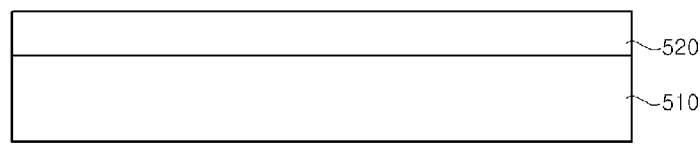

(a) Sapphire substrate    (b) GaN substrate

METHOD FOR SEPARATING EPITAXIAL LAYERS FROM GROWTH SUBSTRATES, AND SEMICONDUCTOR DEVICE USING SAME

CROSS REFERENCE TO RELATED APPLICATIONS

This patent document is a 35 U.S.C. §371 National Stage application of PCT Application No. PCT/KR2013/002227 entitled "METHOD FOR SEPARATING EPITAXIAL LAYERS AND GROWTH SUBSTRATES, AND SEMICONDUCTOR DEVICE USING SAME," filed on Mar. 19, 2013, which claims the benefit of priority to Korean Patent Application No. 10-2012-0027561 entitled "METHOD FOR SEPARATING EPITAXIAL GROWTH LAYER FROM GROWTH SUBSTRATE AND SEMICONDUCTOR DEVICE USING THE SAME," filed on Mar. 19, 2012, Korean Patent Application No. 10-2012-0034341 entitled "METHOD FOR SEPARATING EPITAXIAL GROWTH LAYER FROM GROWTH SUBSTRATE AND SEMICONDUCTOR DEVICE USING THE SAME," filed on Apr. 3, 2012, and Korean Patent Application No. 10-2012-0077658 entitled "METHOD FOR SEPARATING EPITAXIAL GROWTH LAYER FROM GROWTH SUBSTRATE," filed on Jul. 17, 2012. The entire disclosures of the above applications are incorporated by reference as part of this document.

TECHNICAL FIELD

The present invention relates to a method for separating epitaxial layers and growth substrates, and a semiconductor device using the same.

BACKGROUND ART

A light emitting diode generally refers to a PN junction diode in which a p-type semiconductor and an n-type semiconductor are coupled.

In the light emitting diode (LED), when voltage is applied to the p-type and n-type semiconductors coupled to each other, holes of the p-type semiconductor are migrated toward the n-type semiconductor and electrons of the n-type semiconductor are migrated toward the p-type semiconductor such that the electrons and the holes are migrated into a PN junction.

The electrons moved into the PN junction are coupled to the holes while dropping from the conduction band to the valence band. Then, energy is released in the form of light according to an energy gap between the conduction band and the valence band.

Such a light emitting diode is a semiconductor device capable of emitting light and has various advantages such as eco-friendliness, low voltage, long lifetime, low price, and the like. Although such a light emitting diode has been typically used in an indicating lamp or in displaying numerals or other simple information, the light emitting diode has recently been used in many different applications, such as displays, headlamps of vehicles, projectors, and the like, with the development of industrial technologies, in particular, information display technologies and semiconductor technologies.

However, since it is difficult to fabricate a homogenous substrate for growing a semiconductor layer of the light emitting diode, the semiconductor layer is grown on a growth substrate having a similar crystal structure by metal organic chemical vapor deposition (MOCVD), molecular beam epitaxy (MBE), and the like.

As the growth substrate, a sapphire substrate having a hexagonal system is generally used. However, sapphire is a nonconductor of electricity and limits a structure of a light emitting diode to be formed thereon.

Therefore, various studies have been made to develop a technique for fabricating a vertical type light emitting diode by growing an epitaxial layer for the semiconductor layer on a sapphire substrate or a similar growth substrate, and separating the growth substrate.

To separate the growth substrate, the substrate may be removed by grounding. However, the grounding technique for removing the growth substrate, that is, the sapphire substrate, is associated with long processing time and high cost.

Therefore, a laser lift-off (LLO) method, a stress lift-off (SLO) method, or a chemical lift-off (CLO) method is generally used to separate the epitaxial layer from the growth substrate.

In the LLO method, an epitaxial layer is grown on a growth substrate, a bonding substrate is bonded to the epitaxial layer, and a laser beam is emitted through the sapphire substrate so as to separate the epitaxial layer from the growth substrate.

In the SLO method, a convex-concave pattern is formed on one surface of a growth substrate, only a partial region of the growth substrate is subjected to passivation with an insulation film such that an epitaxial layer can be grown only on the other region of the growth substrate, and the epitaxial layer is thickly grown and then cooled, thereby allowing the epitaxial layer to be separated by surface stress.

In the CLO method, a chemically vulnerable material is deposited in a predetermined pattern on one surface of a growth substrate, and then an epitaxial layer is grown and separated by electrochemically or chemically removing the chemically vulnerable material from the growth substrate.

Among these methods of separating the growth substrate, the LLO method has a problem in that properties of the epitaxial layer can be deteriorated by heat generated from a laser beam. Further, the SLO method or the CLO method has a problem that a process becomes complicated since a separate process for processing the surface of the growth substrate is performed before growing the epitaxial layer. In addition, the SLO method or the CLO method has a problem in mass production since it takes more time to separate the epitaxial layer in practice. Moreover, the application of the SLO method is not easy since the epitaxial layer must be grown thickly enough to be separated.

DISCLOSURE

Technical Problem

The present invention is aimed at providing a method for easily separating an epitaxial layer from a growth substrate without affecting the epitaxial layer.

The present invention is also aimed at providing a semiconductor device fabricated using the method of separating an epitaxial layer from a growth substrate.

Technical Solution

Embodiments of the present invention provide a method for separating epitaxial layers from growth substrates, and a semiconductor device using the same. In accordance with one aspect of the present invention, a semiconductor device includes: a support substrate; and a plurality of semiconductor layers formed on the support substrate, wherein an uppermost layer of the semiconductor layers has a surface of non-uniform roughness.

In accordance with another aspect of the present invention, a method of separating a growth substrate from an epitaxial layer includes: preparing a growth substrate; forming a convex-concave pattern comprising a plurality of convex portions and concave portions on one surface of the growth substrate; epitaxially growing a sacrificial layer on the convex portions of the convex-concave pattern; forming a plurality of fine pores by performing electro chemical etching (ECE) on the sacrificial layer; epitaxially growing a plurality of semiconductor layers on the sacrificial layer; attaching a support substrate to the semiconductor layers; and separating the growth substrate, wherein a plurality of voids is formed by merging or growing the fine pores within the sacrificial layer after the semiconductor layers are epitaxially grown on the sacrificial layer.

In accordance with a further aspect of the present invention, a method of separating a growth substrate from an epitaxial layer includes: preparing a growth substrate; forming a convex-concave pattern comprising a plurality of convex portions and concave portions on one surface of the growth substrate; epitaxially growing a sacrificial layer on the convex portions of the convex-concave pattern; forming a mask pattern on the sacrificial layer such that open regions can be formed corresponding to the concave portions of the convex-concave pattern; epitaxially growing a plurality of semiconductor layers over the mask pattern from the sacrificial layer exposed through the open regions; etching at least a portion of the sacrificial layer exposed through the concave portions and a portion of the semiconductor layer formed in the open regions of the mask pattern by injecting an etching liquid for etching the sacrificial layer into the concave portions of the convex-concave pattern; and separating the semiconductor layers from the growth substrate.

In accordance with yet another aspect of the present invention, a method of separating a growth substrate from an epitaxial layer includes: preparing a growth substrate; growing a sacrificial layer on one surface of the growth substrate; forming a plurality of fine pores within the sacrificial layer; forming a plurality of cavities from the plurality of fine pores; and separating the growth substrate using the plurality of cavities.

Advantageous Effects

According to the present invention, a method of easily separating an epitaxial layer from a growth substrate without affecting the epitaxial layer is provided.

In addition, a semiconductor device fabricated using the method of separating an epitaxial layer from a growth substrate is provided.

DESCRIPTION OF DRAWINGS

FIGS. 18 to 24 are cross-sectional views showing the method of fabricating the semiconductor device of FIG. 17.

FIG. 25 is a cross-sectional view showing a method of fabricating a semiconductor device according to yet another embodiment of the present invention.

FIGS. 26 to 32 are cross-sectional views showing a method of separating a growth substrate from a nitride semiconductor layer according to yet another embodiment of the present invention.

BEST MODE

Exemplary embodiments of the present invention will now be described with reference to the accompanying drawings.

Figure 1:
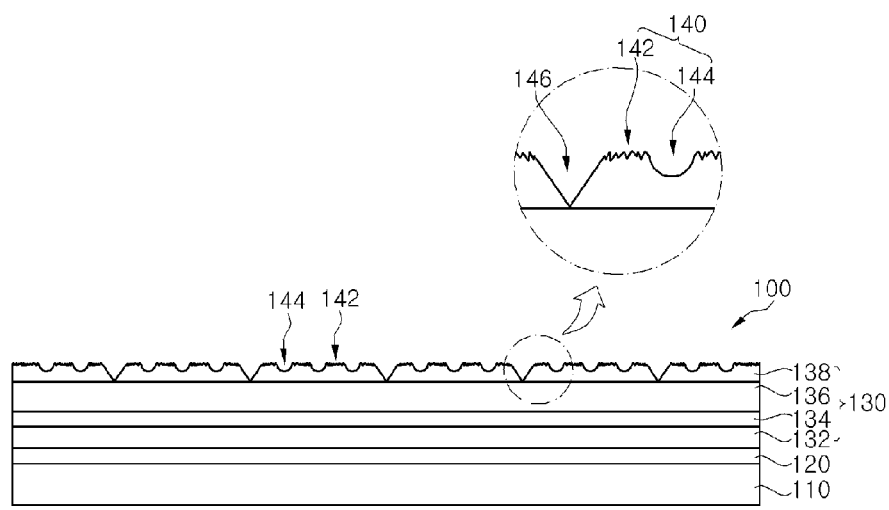
FIG. 1 is a conceptual view of a semiconductor device according to one embodiment of the present invention.

FIG. 1 is a conceptual view of a semiconductor device according to one embodiment of the present invention.

Referring to FIG. 1, a semiconductor device 100 according to one embodiment of the present invention may include a support substrate 110, a bonding layer 120, and a plurality of semiconductor layers 130.

The support substrate 110 may be any kind of substrate capable of supporting the semiconductor layers 130.

The support substrate 110 may include a sapphire substrate, a glass substrate, a silicon carbide substrate, a GaN substrate or a silicon substrate; a conductive substrate formed of or including metallic materials; a circuit substrate such as a printed circuit board (PCB) and the like; and a ceramic substrate containing ceramic.

The bonding layer 120 is formed on the support substrate 110 and serves to bond the support substrate 110 to the semiconductor layer 130.

The bonding layer 120 may be omitted. That is, the bonding layer 120 may be omitted when the structures or materials of the support substrate 110 can be sufficiently bonded to the semiconductor layer 130 without the bonding layer 120. For example, the bonding layer 120 may be omitted when the support substrate 110 is deposited or plated on the semiconductor layers 130 or when the support substrate 110 is mechanically coupled to the semiconductor layers 130 by compression or the like.

The semiconductor layers 130 may include a first type semiconductor layer 132, an active layer 134, a second type semiconductor layer 136, and a sacrificial layer 138. When the semiconductor layer 130 includes at least the active layer 134, the semiconductor device 100 may be a light emitting diode.

The first type semiconductor layer 132 may be or include a group III-N compound semiconductor layer doped with first type impurities, for example, p-type impurities, and may include, for example, an (Al, In, Ga)N group III nitride semiconductor layer. The first type semiconductor layer 132 may be a GaN layer doped with p-type impurities, that is, a p-GaN layer. The first type semiconductor layer 132 may be composed of a single layer or a plurality of layers. For example, the first type semiconductor layer 132 may have a super-lattice structure.

The active layer 134 may be or include a group III-N semiconductor layer, for example, an (Al, Ga, In)N semiconductor layer. The active layer 134 may be composed of a single layer or a plurality of layers that emit light having a certain wavelength. The active layer 134 may have a single quantum-well structure including one well layer (not shown), or a multi quantum-well structure wherein well layers (not shown) and barrier layers (not shown) are alternately stacked one above another. At this time, each or both of the well layer (not shown) and the barrier layer (not shown) may have the super-lattice structure.

The second type semiconductor layer 136 may be or include a group III-N compound semiconductor layer doped with second type impurities, for example, n-type impurities, and may include, for example, an (Al, Ga, In)N group III nitride semiconductor layer. The second type semiconductor layer 136 may be or include a GaN layer doped with n-type impurities, that is, an n-GaN layer. The second type semiconductor layer 136 may be composed of a single layer or a plurality of layers. For example, the second type semiconductor layer 136 may have a super-lattice structure when it is composed of a plurality of layers.

The sacrificial layer 138 may be or include a group III-N compound semiconductor layer doped with the second type impurities, for example, n-type impurities, and may include, for example, an (Al, Ga, In)N group III nitride semiconductor layer. Preferably, the sacrificial layer 138 is or includes an n-GaN layer.

At this time, when the second type semiconductor layer 136 and the sacrificial layer 138 are formed of the same material, the second type semiconductor layer 136 may be omitted, as needed.

The semiconductor layers 130 may further include a super-lattice layer (not shown) or an electron blocking layer (not shown).

The electron blocking layer (not shown) may be disposed between the first type semiconductor layer 132 and the active layer 134, and improve recombination efficiency between electrons and holes. The electron blocking layer (not shown) may include a material having a relatively wide band-gap. The electron blocking layer (not shown) may be formed of or include an (Al, In, Ga)N group III nitride semiconductor, or may be or include a p-AlGaN layer doped with Mg.

The super-lattice layer (not shown) may be disposed between the active layer 134 and the second type semiconductor layer 136, and may have a structure wherein the group III-N compound semiconductors, for example, (Al, Ga, In)N semiconductor layers, are stacked in a plurality of layers, for example, a structure wherein InN layers and InGaN layers are alternately stacked one above another. The super-lattice layer (not shown) is formed prior to the active layer 124 and prevents dislocations or defects from being transferred to the active layer 124, thereby improving crystallinity of the active layer 134 by reducing dislocation or defect density in the active layer 124.

The sacrificial layer 138 may be disposed at an uppermost side of the semiconductor layers 130. The sacrificial layer 138 is used in separation of the semiconductor layers 130 from the growth substrate 210, as described in the following methods of fabricating a semiconductor device.

The sacrificial layer 138 may have a rough surface 140 in a certain region on one surface thereof.

The rough surface 140 may include at least one of a cut surface 142, an inner surface 144 of a cut void, and a plurality of V-shaped etched grooves 146. In FIG. 1, the rough surface 140 includes all of the cut surface 142, the inner surface 144 of the cut void, and the plurality of V-shaped etched grooves 146.

The cut surface 142 is a rough surface that can be formed in a certain region on one surface of the sacrificial layer 138, and may be the same surface as the surface when the sacrificial layer 138 is broken by stress in a horizontal direction (i.e. a direction parallel to the surface of the support substrate 110).

The cut surface 142 may be a surface formed and cut by applying stress to the sacrificial layer 138 in a region without a formation of a void or an etching with an etching liquid, as described in the following methods of fabricating a semiconductor device.

The inner surface 144 of the cut void may be a surface formed when a void having a circular shape, an elliptical shape or the like is cut to expose an inner surface thereof.

The inner surface 144 of the cut void may be a surface formed when the void formed in the sacrificial layer 138 is divided when the sacrificial layer 138 is cut or etched, as described in the following methods of fabricating a semiconductor device.

The plurality of V-shaped etched grooves 146 may be a surface formed when the sacrificial layer 138 is exposed to the etching liquid and etched to have a V-shape.

The plurality of V-shaped etched grooves 146 may be a surface exposed when the sacrificial layer 138 is etched with the etching liquid such that a certain region of the sacrificial layer 138 exposed through a concave portion 222 of the growth substrate 210 is first etched to have a V-shape, as described in the following methods of fabricating a semiconductor device.

Therefore, the semiconductor device 100 according to the embodiment of the invention includes the support substrate 110 and the semiconductor layers 130, in which the uppermost layer of the semiconductor layers 130, i.e. the sacrificial layer 138, has a rough surface 140 of non-uniform roughness, and the rough surface 140 includes the cut surface 142 of the sacrificial layer 138 and the inner surface 144 of the cut void or the plurality of V-shaped etched grooves 146. When the semiconductor device 100 is a light emitting diode, light emitted from the active layer 134 of the semiconductor layers 130 can be easily extracted through the uppermost layer, thereby improving luminous efficiency.

Figure 2:
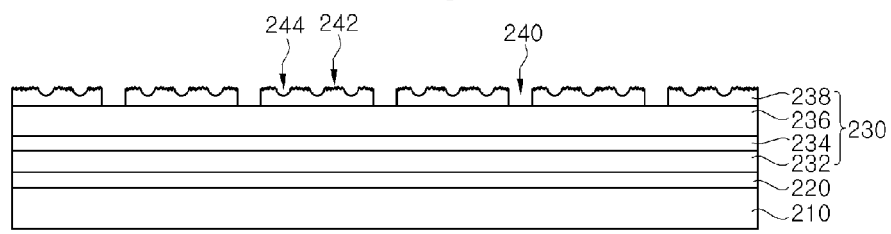
FIG. 2 is a conceptual view of a semiconductor device according to another embodiment of the present invention.

FIG. 2 is a conceptual view of a semiconductor device according to another embodiment of the present invention.

Referring to FIG. 2, a semiconductor device 200 according to this embodiment may include a support substrate 210, a bonding layer 220, and a plurality of semiconductor layers 230.

The semiconductor layers 230 may include a first type semiconductor layer 232, an active layer 234, a second type semiconductor layer 236, and a sacrificial layer 238.

The semiconductor device 200 according to this embodiment of the invention has the same configuration as the semiconductor device 100 described in FIG. 1 except for the sacrificial layer 238. Therefore, repetitive descriptions of the support substrate 210, the bonding layer 220 and the semiconductor layer 230 including the first type semiconductor layer 232, the active layer 234 and the second type semiconductor layer 236 will be omitted.

The elements of the support substrate 210, the bonding layer 220 and the semiconductor layer 230 including the first type semiconductor layer 232, the active layer 234 and the second type semiconductor layer 236 could be understood by referring to the support substrate 110, the bonding layer 120 and the semiconductor layers 130 including the first type semiconductor layer 132, the active layer 134 and the second type semiconductor layer 136.

In this embodiment, the sacrificial layer 238, i.e. the uppermost layer of the semiconductor layer 230, may include at least one open region 240 to expose another semiconductor layer, for example, the second type semiconductor layer 236, under the sacrificial layer 238.

The open region 240 may be formed by partially patterning the sacrificial layer 238 and may expose the layer under the sacrificial layer 238. As described in the following methods of fabricating a semiconductor device, the open region 240 may be formed by forming the sacrificial layer 238 by epitaxial growth on respective convex portions 324 of a growth substrate 310 so as not to be merged into one layer such that the layers grown on the neighboring convex portions 324 do not contact each other.

FIGS. 3 to 9 are cross-sectional views showing a method of fabricating a semiconductor device according to one embodiment of the present invention.

Figure 3:
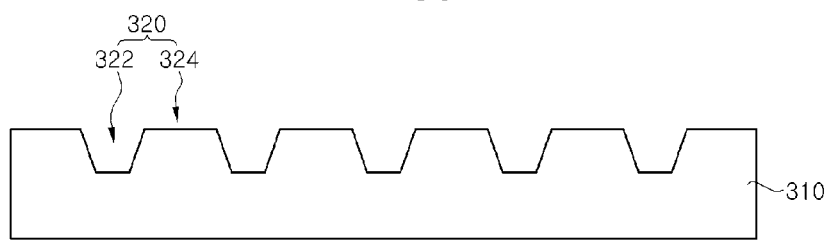
FIGS. 3 to 9 are cross-sectional views showing a method of fabricating a semiconductor device according to one embodiment of the present invention.

Referring to FIG. 3, a growth substrate 310 is first prepared.

The growth substrate 310 may be any substrate on which the semiconductor layer can be formed by epitaxial growth. The growth substrate 310 may be a sapphire substrate, a glass substrate, a silicon carbide (SiC) substrate, a silicon (Si) substrate, or the like. Preferably, the growth substrate 310 may be a sapphire substrate.

A convex-concave pattern 320 having concave portions 322 and convex portions 324 is formed on one surface of the growth substrate 310.

The concave portions 322 have a width and depth of several μm or less, and the convex portions 324 have a width and height of several μm or less.

Here, although FIG. 3 shows the plurality of concave portions 322 and the plurality of convex portions 324, it should be understood that the present invention is not limited thereto. Alternatively, the convex-concave pattern 320 may include a plurality of convex portions 324 and a single concave portion 322 surrounding the respective convex portions 324 (that is, in a structure wherein the convex portions 324 protrude from one surface). The concave portions 322 and the convex portions 324 are alternately provided in the form of a stripe pattern. Here, the concave portions 322 may be connected to one another to allow an etching liquid to be injected into the concave portions 322.

The concave portion 322 may be formed in a trapezoidal groove shape, a cross-section of which has a narrow lower side and a wide upper side.

The convex-concave pattern 320 may be formed by etching the concave portions 322.

Figure 4:
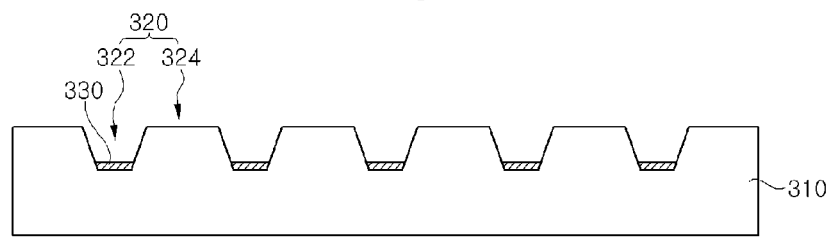

Referring to FIG. 4, a growth control layer 330 is formed in the concave portions 322 of the growth substrate 310.

The growth control layer 330 prevents the semiconductor layers 130 from growing in the concave portions 322 of the convex-concave pattern 320.

The growth control layer 330 may be formed only to an extent of covering bottom surfaces of the concave portions 322. This is because epitaxial growth of the semiconductor layers 130 described below is not substantially performed on a lateral surface between the concave portions 322 and the convex portions 324.

Figure 5:
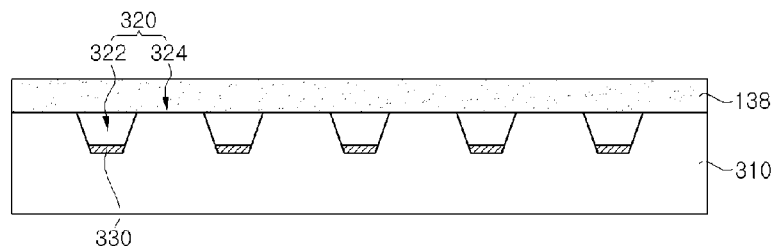

Referring to FIG. 5, the sacrificial layer 138 is formed as one of the semiconductor layers 130 on the growth substrate 310 by epitaxial growth.

The sacrificial layer 138 may include n-GaN, and be formed by epitaxial growth using an MOCVD system or other chemical vapor deposition systems.

The sacrificial layer 138 can be used to appropriately adjust the doping concentration of n-type impurities depending upon processing conditions of electro chemical etching (ECE) described below, i.e. applied voltage, processing time, or processing temperature. Through adjustment of the n-type impurities and the processing conditions of the ECE process, fine pores 331 described below are adjusted, thereby enabling adjustment of the size, number or forming positions of the voids 340.

The sacrificial layer 138 may have a thickness of not more than 3 μm, and preferably a thickness of not more than 2 μm.

Figure 6:
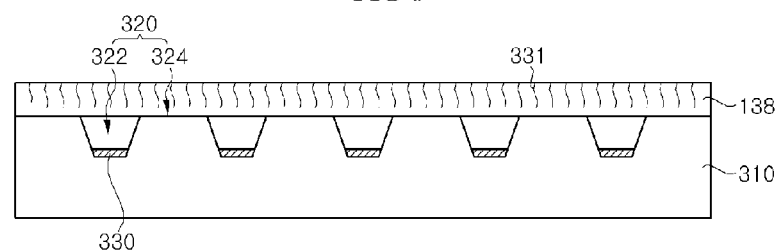

Referring to FIG. 6, the ECE process is applied to the sacrificial layer 138 such that the plurality of fine pores 331 can be formed to a predetermined depth from the surface of the sacrificial layer 138.

In the ECE process, the growth substrate 310 having the sacrificial layer 138 is dipped in an etching liquid, for example, an oxalic acid solution, and voltage is applied thereto. At this time, the ECE process can adjust the depth of the fine pores 331 by controlling the applied voltage, the processing time, or the temperature of the etching liquid.

The fine pores 331 are formed to have a depth of 1 μm when the sacrificial layer 138 is formed to a thickness of 2 μm. It should be understood that the depth of the fine pores 331 can be adjusted, as needed.

Figure 7:
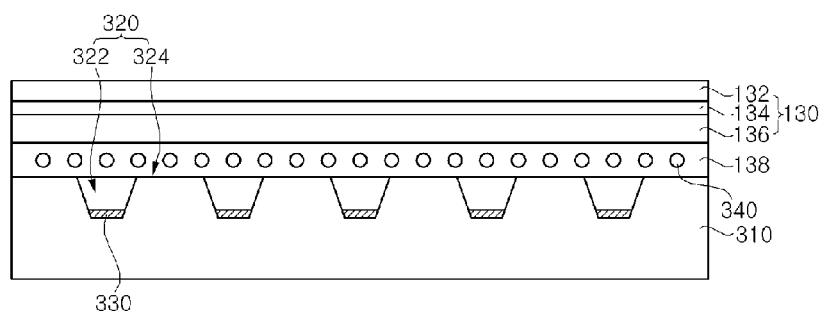

Referring to FIG. 7, the semiconductor layers, that is, the second type semiconductor layer 136, the active layer 134 and the first type semiconductor layer 132, are sequentially formed on the sacrificial layer 138.

The first type semiconductor layer 132, the active layer 134 and the second type semiconductor layer 136 are formed by epitaxial growth using an MOCVD system or other CVD systems.

That is, the semiconductor layers may be formed through regrowth after forming the fine pores 331 in the sacrificial layer 138. Although not shown in detail, the same layer as the sacrificial layer 138, i.e. an additional sacrificial layer (not shown), may be further formed on the sacrificial layer 138 by epitaxial growth, and then the semiconductor layers including the first type semiconductor layer 132, the active layer 134 and the second type semiconductor layer 136 are formed by epitaxial growth.

Since the semiconductor layers including such an additional sacrificial layer (not shown) are formed by epitaxial growth, the plurality of voids 340 are formed from the fine pores 331.

Each of the voids 340 may be formed by merging the plurality of fine pores 331 into one, or by growing a single fine pore 331.

When the semiconductor layers including such an additional sacrificial layer (not shown) are formed by epitaxial growth, the size, the position and the number of voids 340 are controlled by adjusting the growth temperature for epitaxial growth or the kind or flow rate of injected gas.

Figure 8:
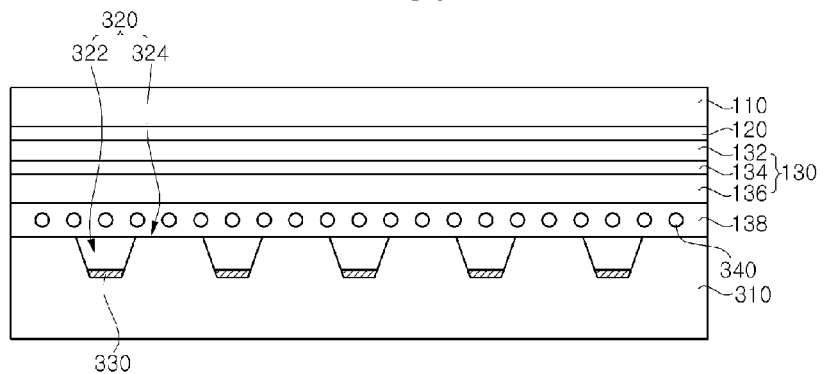

Referring to FIG. 8, the support substrate 110 is attached to the semiconductor layers 130.

The support substrate 110 and the semiconductor layers 130 may be attached by forming the bonding layer 120 between the support substrate 110 and the semiconductor layers 130.

The bonding layer 120 may include a conductive material.

The bonding layer 120 may be omitted. The bonding layer 120 is omitted when the support substrate 110 is thermally or mechanically compressed and attached to the semiconductor layers 130. Alternatively, the bonding layer 120 is omitted when the support substrate 110 is formed on the semiconductor layers by a deposition or plating such that the support substrate 110 can be directly attached to the semiconductor layers 130.

Figure 9:
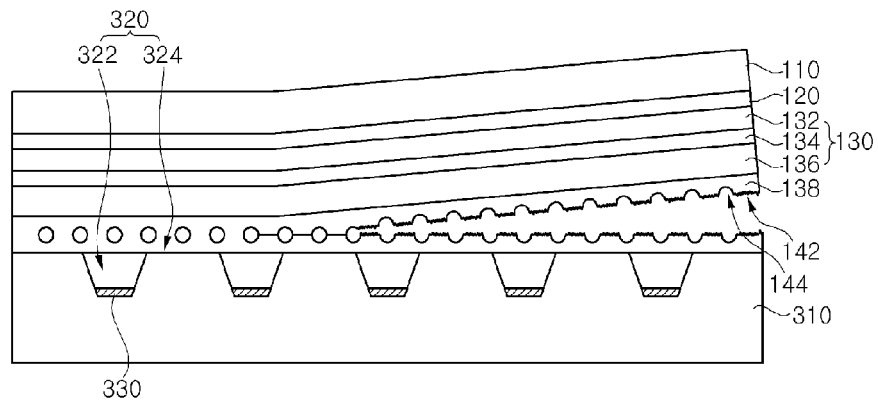

Referring to FIG. 9, the growth substrate 310 is separated from the support substrate 110 having the semiconductor layers 130.

Separation of the growth substrate 310 may be performed by using the sacrificial layer 138.

That is, the growth substrate 310 may be separated by applying stress to the sacrificial layer 138 and breaking the sacrificial layer 138.

Since the voids 340 are formed within the sacrificial layer 138, the sacrificial layer 138 can be easily broken. That is, when stress is applied to the sacrificial layer 138, stress is concentrated on the voids 340 such that regions between the voids 340 are broken, thereby breaking the sacrificial layer 138.

Therefore, as shown in FIG. 9, the sacrificial layer 138 is separated while forming, on a surface of the sacrificial layer 138, the cut surface 142 generated when the sacrificial layer 18 is broken or the inner surface 144 of the cut void generated when the voids 340 are broken.

The separated growth substrate 310 may be reused after a cleaning process for removing a part of the sacrificial layer 138 remaining on the surface thereof.

Figure 10:
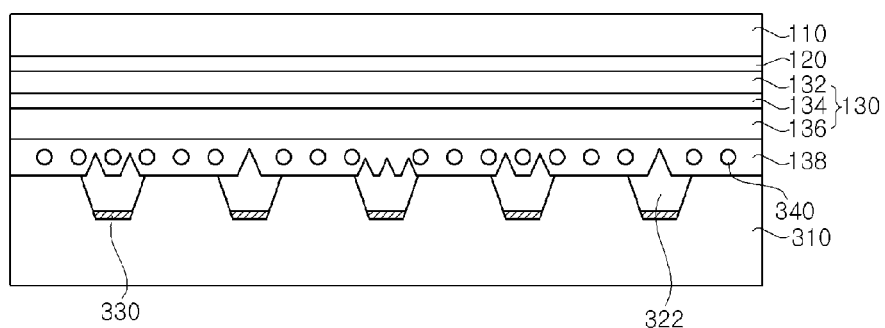
FIGS. 10 to 12 are cross-sectional views showing a method of fabricating a semiconductor device according to another embodiment of the present invention.
Figure 11:
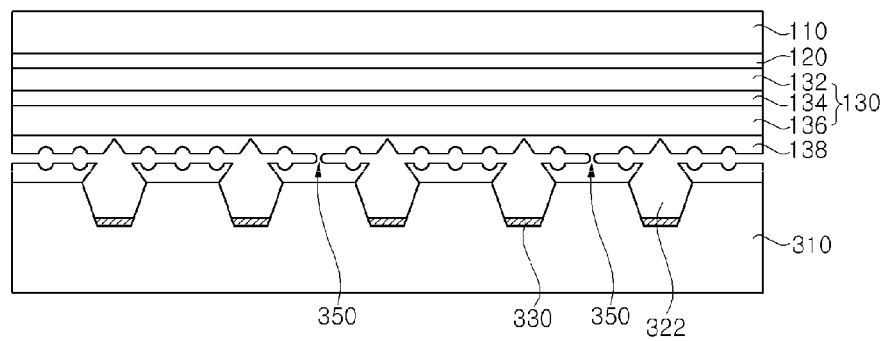
Figure 12:
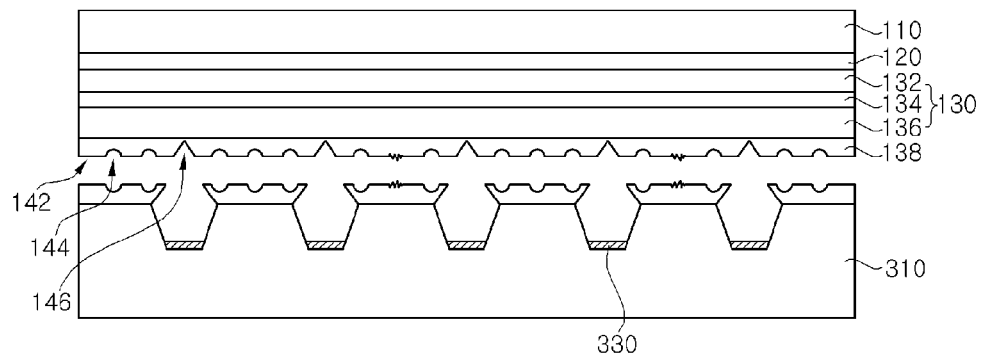

FIGS. 10 to 12 are cross-sectional views showing a method of fabricating a semiconductor device according to another embodiment of the present invention.

Referring to FIG. 10 and FIG. 11, the method of fabricating a semiconductor device according to this embodiment includes the same processes as those of the fabrication method described with reference to FIG. 3 to FIG. 9, except for the process of separating the growth substrate 310. Therefore, repetitive descriptions thereof will be omitted.

After attaching the support substrate 110 to the semiconductor layers 130 including the sacrificial layer 138 formed therein with the voids 340 via the bonding layer 120, the etching liquid is injected into the concave portions 322 of the growth substrate 310 to etch the sacrificial layer 138.

The etching liquid may include any etching liquid capable of selectively etching the sacrificial layer 138, which may an etching liquid containing sodium hydroxide, hydrogen peroxide and pure water, an etching liquid containing potassium hydroxide and pure water, or an etching liquid containing sulfuric acid.

When the sacrificial layer 138 is continuously etched using the etching liquid, as shown in FIG. 11, a plurality of V-shaped etched grooves 146 may be formed on the sacrificial layer 138. In addition, the etching liquid etches the sacrificial layer 138 in a lateral direction along the voids 340, thereby etching and separating the sacrificial layer 138.

At this time, a certain region 350 of the sacrificial layer 138 may remain instead of being separated, since no etching liquid penetrates the sacrificial layer 138. Of course, the certain region 350 may be removed by controlling the etching process.

Referring to FIG. 12, the growth substrate 310 is separated from the semiconductor layers 130 including the sacrificial layer 138 by etching the sacrificial layer 138 with the etching liquid or applying stress to the sacrificial layer 138 after etching the sacrificial layer 138 with the etching liquid.

In the semiconductor device fabricated by the method according to this embodiment, the sacrificial layer 138 on the support substrate 110 includes the cut surface 142, the inner surface 144 of the cut void, or the plurality of V-shaped etched grooves 146, as shown in FIG. 12.

Figure 13:
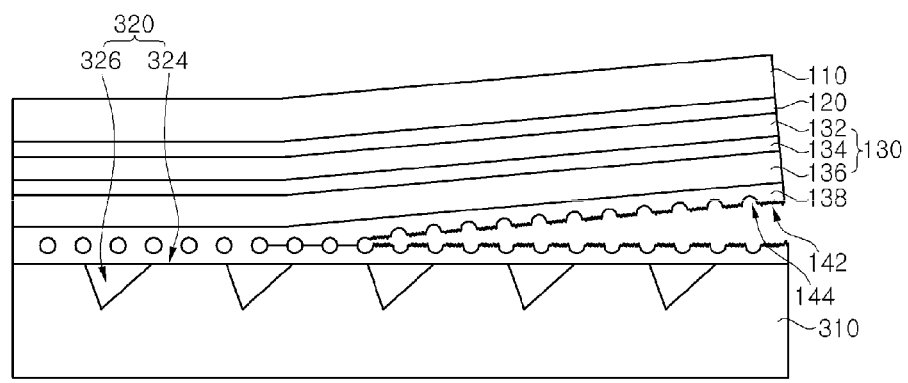
FIG. 13 is a cross-sectional view showing a method of fabricating a semiconductor device according to a further embodiment of the present invention.

FIG. 13 is a cross-sectional view showing a method of fabricating a semiconductor device according to yet another embodiment of the present invention.

Referring to FIG. 13, the method of fabricating a semiconductor device according to this embodiment includes substantially the same process as the fabrication method described with reference to FIG. 3 to FIG. 9, except that the convex-concave pattern 320 of the growth substrate 310 has a different shape and thus there is no need for the growth control layer 330. Therefore, repetitive descriptions thereof will be omitted.

That is, according to this embodiment, the convex-concave pattern 320 is formed in the process of preparing the growth substrate 310. The concave portions 326 are formed as grooves having V-shaped cross-sections instead of the trapezoidal cross section having a narrow bottom side and a wide top side.

Here, the concave portions 326 may be formed by etching the growth substrate 310 with an etching liquid, for example, an etching liquid containing sulfuric acid or phosphoric acid.

When the growth substrate 310 is a sapphire substrate, the concave portions 326 may be formed as V-shaped grooves by etching the c-plane and the r-plane of the sapphire substrate using the etching liquid.

Figure 14:
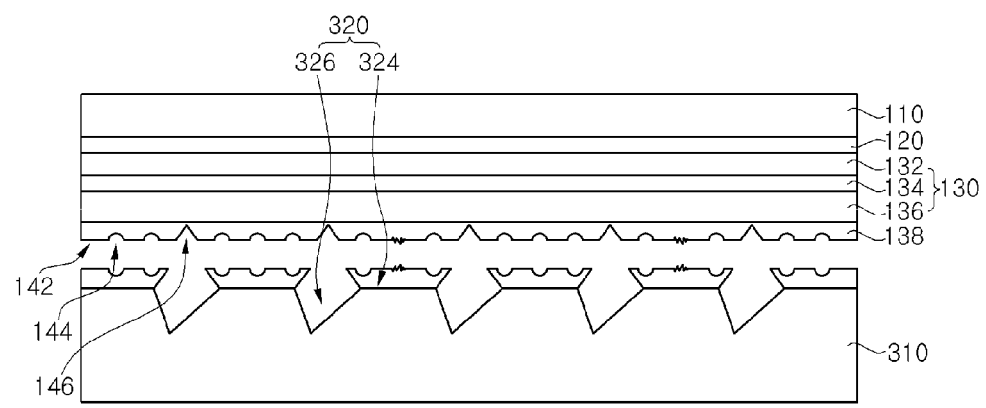
FIG. 14 is a cross-sectional view showing a method of fabricating a semiconductor device according to yet another embodiment of the present invention.

FIG. 14 is a cross-sectional view showing a method of fabricating a semiconductor device according to yet another embodiment of the present invention.

Referring to FIG. 14, the method of fabricating a semiconductor device according to this embodiment of the invention includes substantially the same process as the fabrication method described with reference to FIG. 10 to FIG. 12, except that the convex-concave pattern 320 of the growth substrate 310 has a different shape and thus there is no need for the growth control layer 330. Therefore, repetitive descriptions thereof will be omitted.

According to this embodiment, the convex-concave pattern 320 is the same as the convex-concave pattern 320 including the concave portions 326 and the convex portions 324 described with reference to FIG. 13, and thus repetitive descriptions thereof will be omitted.

Figure 15:
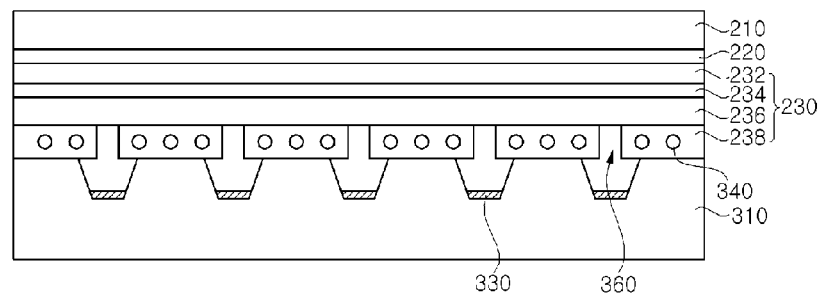
FIGS. 15 to 16 are cross-sectional views showing a method of fabricating a semiconductor device according to yet another embodiment of the present invention.
Figure 16:
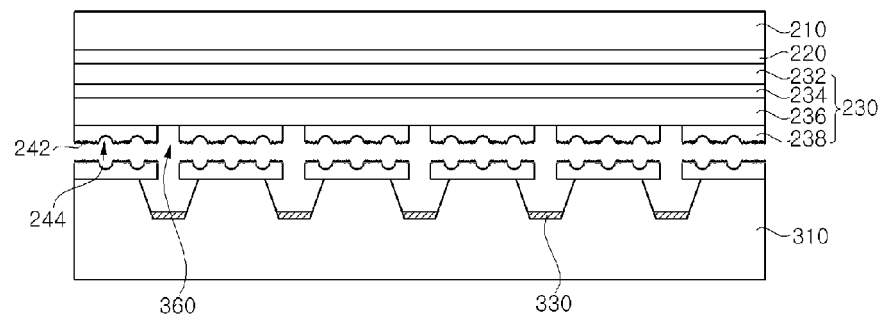

FIGS. 15 to 16 are cross-sectional views showing a method of fabricating a semiconductor device according to yet another embodiment of the present invention. Here, this method will be described based on the method of fabricating the semiconductor device 200 described with reference to FIG. 2.

Referring to FIG. 15, the method of fabricating a semiconductor device according to this embodiment includes preparing a growth substrate 310 as described with reference to FIG. 3 and FIG. 4, and forming a convex-concave pattern 320 including a plurality of concave portions 322 and convex portions 324 on one surface of the growth substrate 310. The convex-concave pattern 320 may include convex portions 324 and concave portions 326 formed as V-shaped grooves as described with reference to FIG. 13 or FIG. 14.

Then, like the sacrificial layer 138 described in FIG. 5, a sacrificial layer 238 may be formed on the growth substrate 310 by epitaxial growth.

The sacrificial layer 138 described in FIG. 5 is formed by merging many seed layers (not shown) respectively grown on the plurality of convex portion 324 with each other, whereas the sacrificial layer 238 in this embodiment is formed to have a plurality of open regions 260 by stopping epitaxial growth before many seed layers (not shown) respectively grown in the convex portions 324 are merged with each other.

Although not shown, the sacrificial layer 238 having the plurality of open regions 260 may also be formed by forming the sacrificial layer 138 by the process described with reference to FIG. 5, followed by partially patterning the sacrificial layer 1348 through an etching process or the like.

After forming the sacrificial layer 238, a first type semiconductor layer 232, an active layer 234, a second type semiconductor layer 236, a bonding layer 220 and a support substrate 210 are formed and attached using the same processes described with reference to FIG. 6 through FIG. 8 for forming and attaching the first type semiconductor layer 132, the active layer 134, the second type semiconductor layer 136, the bonding layer 120 and the support substrate 110. Here, repetitive descriptions will be omitted.

Referring to FIG. 16, after the support substrate 210 is attached to the semiconductor layer 230, the growth substrate 310 is separated by the same method as the method described with reference to FIG. 9, i.e. by applying stress to the sacrificial layer 238, thereby forming the semiconductor device 200.

At this time, on a surface of the sacrificial layer 238, a cut surface 242 and an inner surface 244 of a cut void are formed using the same method as the method of forming the cut surface 142 and the inner surface 144 of the cut void described with reference to FIG. 9.

In addition, the sacrificial layer 238 may include a plurality of open regions 360 exposing the semiconductor layer under the sacrificial layer 238, for example, the surface of the second type semiconductor layer 236. At this time, the open regions 360 may be formed in regions corresponding to the concave portions 322 of the growth substrate 310, respectively.

Figure 17:
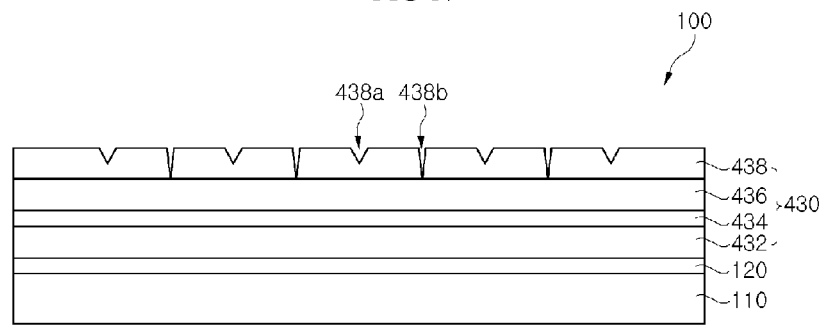
FIG. 17 is a conceptual view of a semiconductor device according to yet another embodiment of the present invention.

FIG. 17 is a conceptual view of a semiconductor device according to yet another embodiment of the present invention.

Referring to FIG. 17, a semiconductor device 100 according to one embodiment of the present invention may include a support substrate 110, a bonding layer 120, and a plurality of semiconductor layers 430.

The support substrate 110 and the bonding layer 120 are the same as those of the semiconductor device 100 shown in FIG. 1 and FIG. 2, and thus repetitive descriptions thereof will be omitted. In addition, components of the semiconductor layer 430 are the same as those of the semiconductor device 100 shown in FIG. 1 and FIG. 2 except for an uppermost layer 438, and thus repetitive descriptions thereof will be omitted.

The uppermost layer 438 is formed on an uppermost side of the semiconductor layers 430.

In addition, the uppermost layer 438 may include V-shaped etched grooves 438a or unmerged grooves 438b on the surface thereof.

The V-shaped etched grooves 438a may be formed by partially etching the uppermost layer 438 when the semiconductor layers 430 including the uppermost layer 438 are separated from the growth substrate 110, as described in the following methods of fabricating a semiconductor device according to one embodiment of the invention. Further, the unmerged grooves 438b may be formed by controlling epitaxial growth when the uppermost layer 438 is formed by epitaxial growth. In the following method, the V-shaped etched grooves 438a or the unmerged grooves 438b will be described in more detail.

FIGS. 18 to 24 are cross-sectional views showing a method of fabricating the semiconductor device of FIG. 17.

Figure 18:
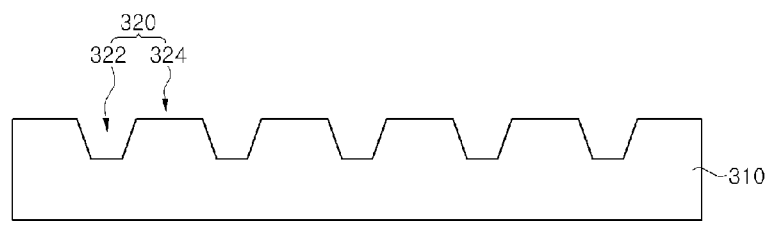

Referring to FIG. 18, first, a growth substrate 310 is prepared.

The growth substrate 310 may be any substrate on which the semiconductor layer can be formed by epitaxial growth. The growth substrate 310 may include a sapphire substrate, a glass substrate, a silicon carbide (SiC) substrate, or a silicon (Si) substrate. Preferably, the growth substrate 310 is a sapphire substrate.

A convex-concave pattern 320 including concave portions 322 and convex portions 324 is formed on one surface of the growth substrate 310.

The concave portions 322 have a width and depth of several μm or less, and the convex portions 324 have a width and height of several μm or less.

Here, although FIG. 18 shows the plurality of concave portions 322 and the plurality of convex portions 324, it should be understood that the present invention is not limited thereto. Alternatively, the convex-concave pattern 320 may include a plurality of convex portions 324 and a single concave portion 322 surrounding the respective convex portions 324 (i.e. in a structure wherein the convex portions 324 protrude from one surface). The concave portions 322 and the convex portions 324 are alternately provided in the form of a stripe pattern. Here, the concave portions 322 may be connected to one another to allow an etching liquid to be injected into the concave portions 322.

The concave portion 322 may be formed in a trapezoidal groove shape, a cross-section of which has a narrow lower side and a wide upper side.

The convex-concave pattern 320 may be formed by etching the concave portions 322.

Figure 19:
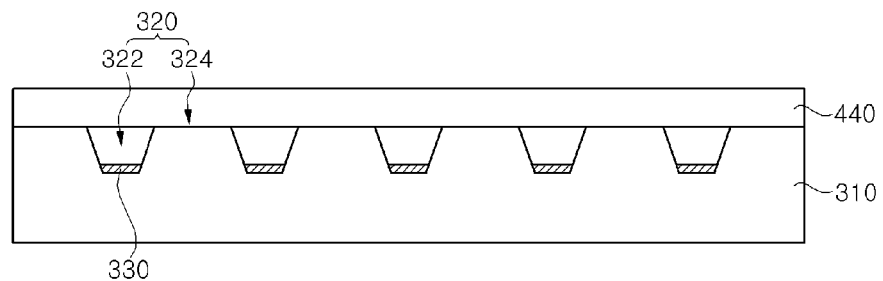

Referring to FIG. 19, a growth control layer 330 is formed in the concave portions 322 of the growth substrate 310.

The growth control layer 330 prevents the semiconductor layers from growing in the concave portions 322 of the convex-concave pattern 320.

The growth control layer 330 may be formed of an insulation film such as silicon oxide ($SiO_2$), silicon nitride (SiN), etc. In addition, the growth control layer 330 may be formed of the same material as that of the mask pattern.

The growth control layer 330 may be formed only to an extent of covering bottom surfaces of the concave portions 322. This is because epitaxial growth of the semiconductor layers 130 described below is not substantially performed on a lateral surface between the concave portions 322 and the convex portions 324.

Then, the sacrificial layer 440 is formed on the growth substrate 310 by epitaxial growth.

The sacrificial layer 140 may include a semiconductor layer including GaN, for example, n-GaN, and be formed by epitaxial growth using an MOCVD system or other chemical vapor deposition systems. Here, the sacrificial layer 440 may be realized by a μ-GaN layer doped with no impurity, like the uppermost layer 438.

Figure 20:
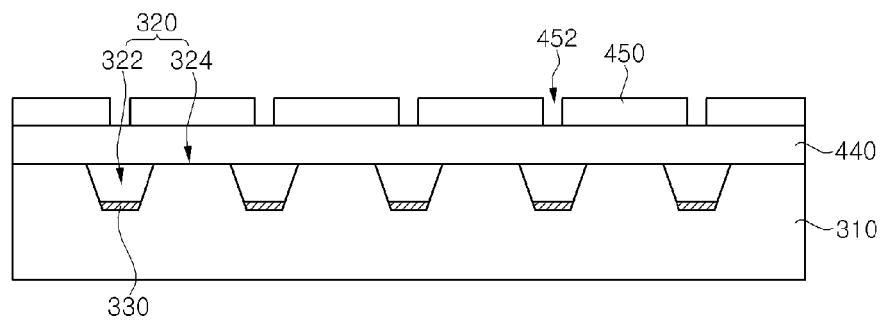

Referring to FIG. 20, a mask pattern 450 may be formed on the sacrificial layer 440.

The mask pattern 450 may be formed of a material having a higher etch selectivity than the sacrificial layer 440, and may be formed of an insulation layer, such as silicon oxide, silicon nitride and the like.

The mask pattern 450 may include open regions 452 that expose the sacrificial layer 440 under the mask pattern 450.

The open regions 452 may be placed in regions corresponding to the concave portions 322 of the convex-concave pattern 320.

Figure 21:
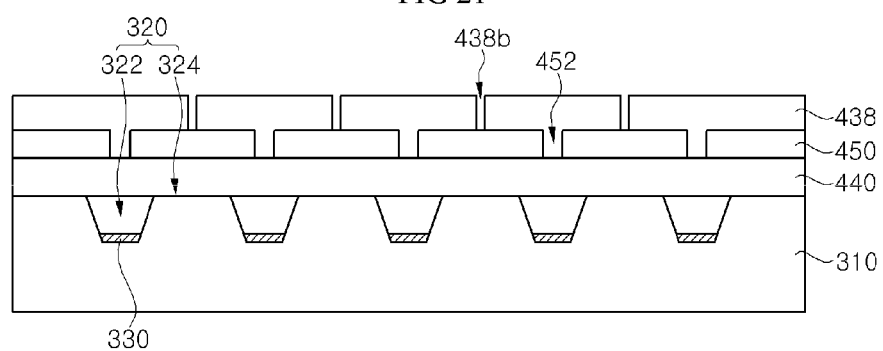

Referring to FIG. 21, the mask pattern 450 is formed on the sacrificial layer 440, and then the uppermost layer 438 is grown from the surface of the sacrificial layer 440 under the mask pattern 450 and exposed through the open regions 452.

At this time, the uppermost layer 438 may be epitaxially grown until the epitaxial layers are epitaxially grown from the neighboring open regions 452 and completely merged into one layer.

As shown in FIG. 21, the uppermost layer 438 may be epitaxially grown over the mask pattern 450 from the neighboring open regions 452 such that the grown epitaxial layers are not completely merged with one another. That is, the uppermost layer 438 is epitaxially grown over the mask pattern 450 from the neighboring open regions 452 within the uppermost layer 438 such that the grown epitaxial layers are not completely merged so as to have the unmerged groove 438b.

Figure 22:
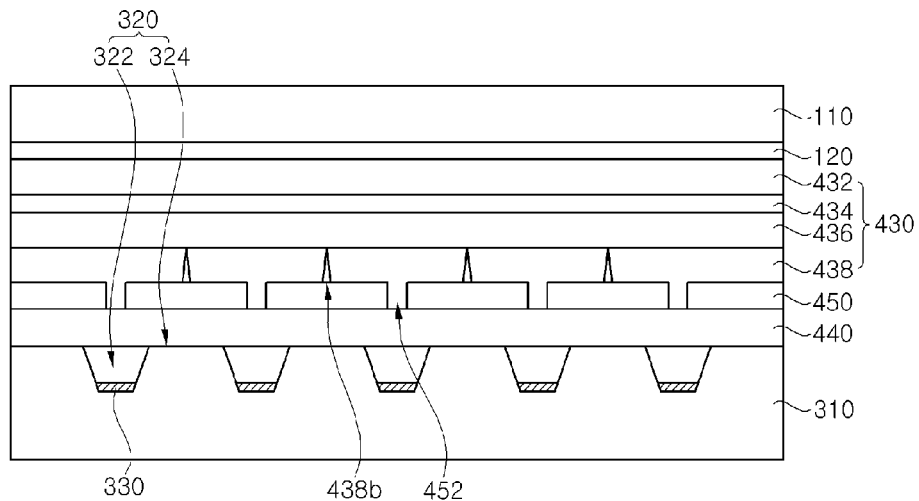

Referring to FIG. 22, the semiconductor layers, i.e. a second type semiconductor layer 436, an active layer 434 and a first type semiconductor layer 432 are sequentially formed after forming the uppermost layer 438.

The first type semiconductor layer 432, the active layer 434 and the second type semiconductor layer 436 may be formed by epitaxial growth using an MOCVD system or other chemical vapor deposition systems.

After epitaxial growth of the semiconductor layers 430 is completed, the support substrate 110 is attached to the semiconductor layers 130.

At this time, the support substrate 110 and the semiconductor layers 430 may be attached by forming a bonding layer 120 between the support substrate 110 and the semiconductor layers 430 and providing a connection between the support substrate and the semiconductor layers 430.

The bonding layer 120 may include a conductive material.

The bonding layer 120 may be omitted. The bonding layer 120 is omitted when the support substrate 110 is thermally or mechanically compressed and attached to the semiconductor layers 130. Alternatively, the bonding layer 120 is omitted when the support substrate 110 is formed on the semiconductor layers 130 by a deposition or plating such that the support substrate 110 can be directly attached to the semiconductor layers 130.

Figure 23:
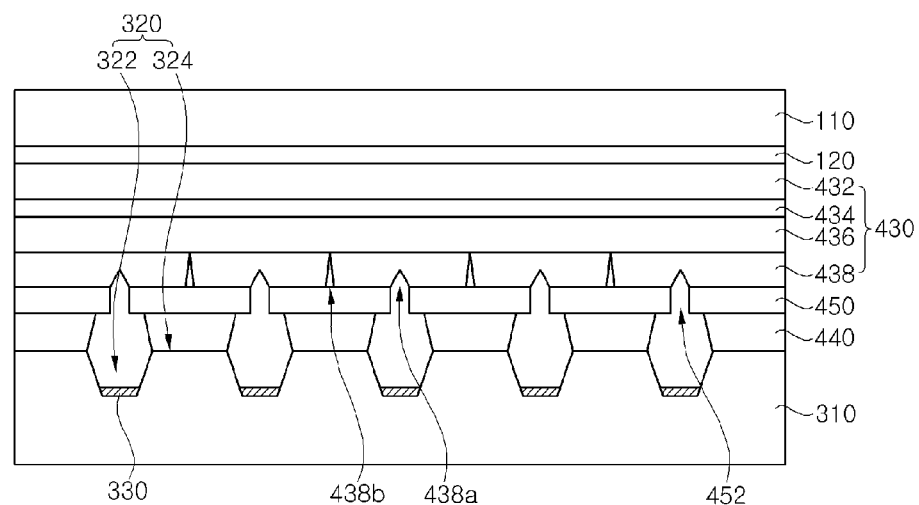

Referring to FIG. 23, the sacrificial layer 440 is etched by injecting an etching liquid into the concave portions 322 of the growth substrate 310.

At this time, the etching liquid etches the semiconductor layer 430 including the sacrificial layer 440 but does not etch the mask pattern 450.

The etching liquid partially etches the sacrificial layer 440 exposed through the concave portions 322 of the convex-concave pattern 320, and etches a portion of the semiconductor layers 430, i.e. a portion of the uppermost layer 438 provided within the open regions 452 of the mask pattern 450.

When the uppermost layer 438 is sufficiently etched by the etching liquid, portions of the uppermost layer 438 provided not only in the open regions 452 of the mask pattern 450 but also in the open regions 452 of the mask pattern 450 are etched, whereby V-shaped etched grooves 438a can be formed on the surface of the uppermost layer 438 when the semiconductor layers 430 is separated from the growth substrate 210. In addition, etching of the uppermost layer 438 using the etching liquid is properly controlled such that the V-shaped etched grooves 438a are not formed on the surface of the uppermost layer 438. In addition, protrusions (not shown) may be formed in regions corresponding to the V-shaped etched grooves 438a, unlike those shown in FIG. 17 or FIG. 23. That is, the portions of the uppermost layer 438 within the open regions 452 may be not completely etched, whereby the protrusions (not shown) can be formed on the surface of the uppermost layer 438.

Referring to FIG. 24, the mask pattern 450 is removed to separate the growth substrate 210 from the support substrate 110 having the semiconductor layers 430 formed thereon, thereby forming the semiconductor device 100 as described with reference to FIG. 1.

The mask pattern 450 may be removed by various methods, for example, a method using a buffered oxide etchant (BOE), HF, or a similar liquefied or gaseous etching material including fluorine (F). When the growth control layer 330 is formed of the same material as the mask pattern 450, the growth control layer may be removed by the same material or process of removing the mask pattern 450.

Although not shown, mesa etching for partially exposing a surface of the first semiconductor layer 432 may be performed by partially etching the uppermost layer 438, the second semiconductor layer 436 and the active layer 434, and then a first electrode (not shown) is formed on the partially exposed surface of the first semiconductor layer 432, followed by forming a transparent electrode layer (not shown) and a second electrode (not shown) on the uppermost layer 438. Thus, it is possible to fabricate a light emitting diode using the semiconductor device 100.

FIG. 25 is a cross-sectional view showing a method of fabricating a semiconductor device according to yet another embodiment of the present invention.

Referring to FIG. 25, the method of fabricating a semiconductor device according to this embodiment of the invention includes the same processes as those of the fabrication method described with reference to FIG. 18 to FIG. 24, except that the convex-concave pattern 320 of the growth substrate 310 has a different shape and thus there is no need for the growth control layer 330 (see FIG. 24). Thus, repetitive descriptions thereof will be omitted.

That is, in this embodiment, the convex-concave pattern 320 is formed in the process of preparing the growth substrate 310, in which concave portions 326 are formed in a groove shape having a V-shaped cross section, instead of the trapezoidal cross section having a narrow bottom side and a wide top side.

Here, the concave portions 326 may be formed by etching the growth substrate 310 with an etching liquid, for example, an etching liquid including sulfuric acid or phosphoric acid.

When the growth substrate 310 is a sapphire substrate, the concave portions 326 may be formed as V-shaped grooves when the etching liquid etches c-surface and r-surface of the sapphire substrate.

FIGS. 26 to 32 are cross-sectional views showing a method of separating a growth substrate from a nitride semiconductor layer according to yet another embodiment of the present invention.

Figure 33:
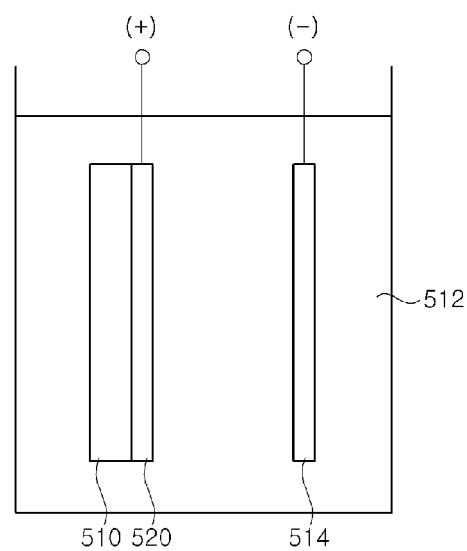
FIG. 33 is a cross-sectional view of one example of a light emitting diode including a nitride semiconductor layer separated by the method of separating a growth substrate from a nitride semiconductor layer according to yet another embodiment of the present invention.

FIG. 33 is a cross-sectional view of one example of a light emitting diode including a nitride semiconductor layer separated by the method of separating a growth substrate from a nitride semiconductor layer according to this embodiment of the invention.

Figure 34:
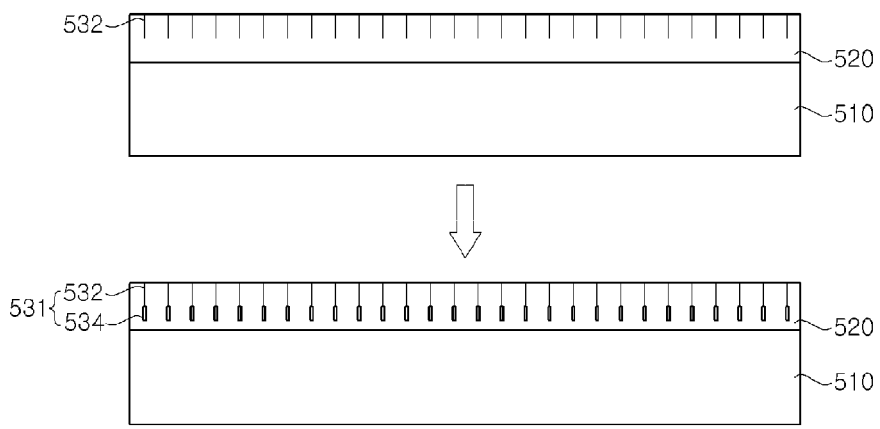
FIG. 34 is a conceptual view of electro chemical etching (ECE).

FIG. 34 is a conceptual view of electro chemical etching (ECE).

Figure 35:
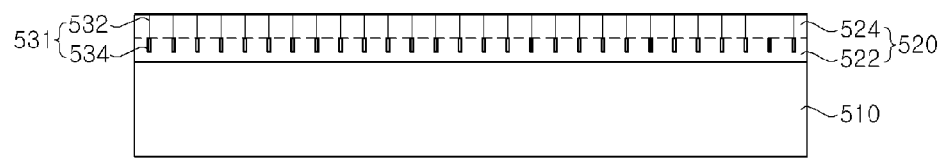
FIGS. 35 and 36 are sectional views showing examples of fine pores formed by the ECE process.
Figure 36:
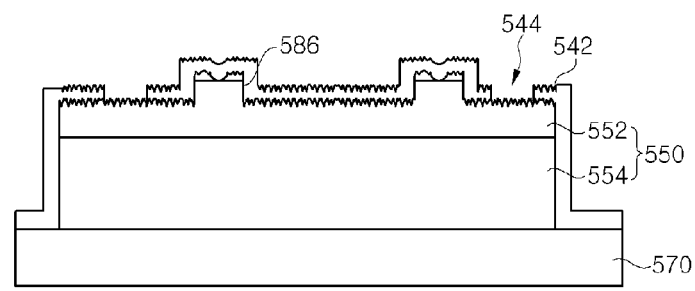

FIGS. 35 and 36 are sectional views showing examples of fine pores formed by the ECE process.

Referring to FIG. 26, in the method of separating a growth substrate from a nitride semiconductor layer according to this embodiment, first, a growth substrate 510 is prepared.

The growth substrate 510 may include a sapphire substrate, a GaN substrate, a glass substrate, a silicon carbide (SiC) substrate, a silicon (Si) substrate, or the like. Preferably, the growth substrate 510 is a sapphire substrate or a GaN substrate.

After placing the growth substrate 510 in a chamber of an epitaxial growth system such as an MOCVD system, a sacrificial layer 520 is grown on the growth substrate 510. The sacrificial layer 520 may include GaN doped with impurities, preferably n-GaN highly doped with n-type impurities.

Figure 27:
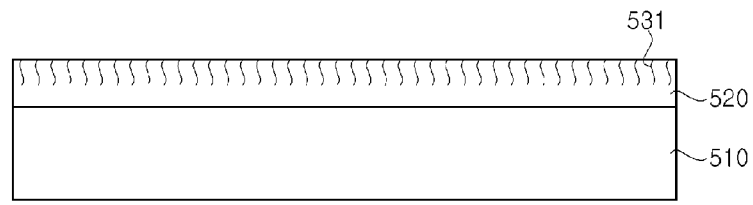

Referring to FIG. 27, a plurality of fine pores 531 are formed in the sacrificial layer 520.

The fine pores 531 may be formed by the ECE process.

In the ECE process as shown in FIG. 8, the growth substrate 510 having the sacrificial layer 520 formed thereon is dipped into an ECE solution 512, and then the fine pores 531 are formed by an electric field generated upon voltage application.

The ECE solution 512 may be an electrolyte solution, and preferably an electrolyte solution including oxalic acid, HF or NaOH.

In the ECE process, a negative electrode 514 is placed in the ECE solution 512. The negative electrode 514 is separated by a predetermined distance from the sacrificial layer 520 when the sacrificial layer 520 is dipped into the ECE solution 512.

In the ECE process, with the sacrificial layer 520 dipped into the ECE solution 512, a (+) power terminal is applied to the sacrificial layer 520 and a (−) power terminal is applied to the negative electrode 514.

The fine pores 531 may be formed to a predetermined depth from the surface of the sacrificial layer 520 inside the sacrificial layer 520. The depth or the diameter of the fine pores 531 may be adjusted by controlling the applied voltage, the processing time, the doping concentration of the sacrificial layer 520, or the temperature of the ECE solution.

As shown in FIG. 33 and FIG. 34, the fine pores 531 may include at least two regions, i.e. first fine pores 532 and second fine pores 534. The second fine pores 534 may have a larger diameter than the first fine pores 532.

The fine pores 531 are formed to have the first fine pores 532 and the second fine pores 53 such that a region close to the surface of the sacrificial layer 520, i.e. the first fine pores 532, can be formed with fine pores having a small diameter and the interior of the sacrificial layer 520, i.e. the second fine pores 534, can be formed with fine pores having a large diameter, thereby reducing damage to the nitride semiconductor layer 550 when the nitride semiconductor layer 550 is grown again on the sacrificial layer 520, while forming large cavities 560 inside the sacrificial layer 520 or increasing the number of cavities 560.

As shown in FIG. 34, in the process of forming the fine pores 531, the fine pores 531 are formed by applying voltage of at least two levels after the sacrificial layer 520 is dipped into the ECE solution, whereby the first fine pores 532 and the second fine pores 534 can be formed.

That is, the first fine pores 532 are first formed by a first voltage and the second fine pores 534 are formed by a second voltage higher than the first voltage.

Therefore, in the process of forming the fine pores 531 as shown in FIG. 34, at least two different voltages are applied to form the fine pores 531.

As shown in FIG. 35, in the process of forming the fine pores 531, when the sacrificial layer 520 is formed, the first fine pores 532 and the second fine pores 534 are formed by forming a first sacrificial layer 522 and a second sacrificial layer 524 having different impurity concentrations, dipping the growth substrate 510 formed with the first sacrificial layer 522 and the second sacrificial layer 524 into the ECE solution, and applying voltage thereto. Here, the first sacrificial layer 522 may be doped with a higher concentration of impurities than the second sacrificial layer 524.

Thus, in the process of forming the fine pores 531 as shown in FIG. 35, when the sacrificial layer 520 is formed, at least two sacrificial layers 520 having different impurity concentrations are formed and then subjected to the ECE process.

In the process of forming the fine pores 531 as shown in FIG. 35, the ECE process is realized by applying voltage of one level. However, voltage of two or more levels may be applied and the size of first fine pores 532 may be increased.

Figure 28:
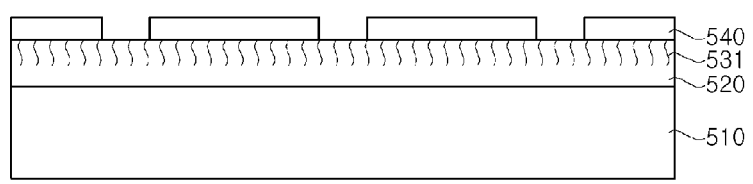

Referring to FIG. 28, an insulation pattern 540 is formed on the sacrificial layer 520 having the fine pores.

The insulation pattern 540 may include an insulation material, such as silicon oxide or silicon nitride.

The insulation pattern 540 may include open regions in the form of a stripe or mesh pattern.

The width, thickness, shape, and the like of the insulation pattern 540 may be determined in consideration of dicing or light extraction efficiency when the light emitting diode is formed using the nitride semiconductor layer separated by the method of separating a growth substrate from a nitride semiconductor layer according to one embodiment of the present invention.

The insulation pattern 540 may have a thickness of 240 nm.

Figure 29:
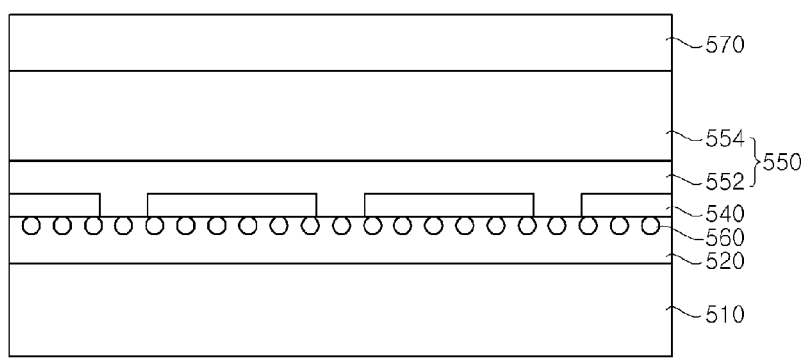

Referring to FIG. 29, a plurality of nitride semiconductor layers 550 are formed on the sacrificial layer 520 formed with the insulation pattern 540.

The plurality of nitride semiconductor layers 550 may be formed through regrowth by placing the growth substrate 510 again into the chamber of the epitaxial growth system such as a MOCVD system.

That is, the plurality of nitride semiconductor layers 550 may be epitaxially grown from the surface of the sacrificial layer 520 exposed through the open regions of the insulation pattern 540.

Here, the fine pores 531 of the sacrificial layer 520 may be formed as the plurality of cavities 560 when the plurality of nitride semiconductor layers 550 is formed by epitaxial growth.

The plurality of cavities 560 may be formed by merging the plurality of fine pores 531 into one, or expanding one fine pore 531.

When the plurality of nitride semiconductor layers 550 are epitaxially grown, the size, position, number, etc. of cavities 560 may be adjusted by controlling the temperature for epitaxial growth, or the kind and flow rate of injected gas.

The cavities 560 are generally formed in an upper region of the sacrificial layer 520 (here, the upper region of the sacrificial layer 520 refers to a region close to an interface bordering the plurality of nitride semiconductor layers 550).

The cavities 560 may be formed to be larger in a distant region of the sacrificial layer 520 from the plurality of nitride semiconductor layers 550 than a close region, and may be formed to become larger with increasing distance from the plurality of nitride semiconductor layers 550.

FIG. 29 shows that the plurality of nitride semiconductor layers 550 includes a first nitride semiconductor layer 552 and a second nitride semiconductor layer 554, without being limited thereto. Alternatively, the nitride semiconductor layer may be a single layer, or may include three or more layers.

The first nitride semiconductor layer 552 may be a buffer layer and the second nitride semiconductor layer 554 may be a semiconductor layer including at least an active layer.

That is, the first nitride semiconductor layer 552 may be an n-GaN layer doped with n-type impurities or a μ-GaN layer doped with no impurity.

The second nitride semiconductor layer 554 may include a first type semiconductor layer (not shown), an active layer (not shown), and a second type semiconductor layer (not shown). The first type semiconductor layer (not shown) may be a group III-N compound semiconductor layer doped with first type impurities, for example, n-type impurities, and may include, for example, an (Al, In, Ga)N group III nitride semiconductor, that is, an n-GaN layer.

The active layer (not shown) may be a group III-N semiconductor layer, for example, an (Al, Ga, In)N semiconductor layer. The active layer 134 may be composed of a single layer or a plurality of layers, and emit light having a certain wavelength. The active layer (not shown) may have a single quantum-well structure including one well layer (not shown), or a multi-quantum well structure wherein well layers (not shown) and barrier layers (not shown) are alternately stacked one above another. At this time, each or both of the well layer (not shown) and the barrier layer (not shown) may have a super-lattice structure.

The second type semiconductor layer (not shown) may be a group III-N compound semiconductor layer doped with second type impurities, for example, p-type impurities, and may include, for example, an (Al, Ga, In)N group III nitride semiconductor, that is, a p-GaN layer.

The second nitride semiconductor layer 554 may further include a super-lattice layer (not shown) or an electron blocking layer (not shown).

Then, a support substrate 570 is attached to the plurality of nitride semiconductor layers 550.

The support substrate 570 may include a sapphire substrate, a GaN substrate, a glass substrate, a silicon carbide substrate or a silicon substrate; a conductive substrate formed of metallic materials; a circuit substrate such as a printed circuit board (PCB) or the like; and a ceramic substrate containing ceramic.

Although not shown in FIG. 29, a bonding layer (not shown) may be disposed between the plurality of nitride semiconductor layers 550 and the support substrate 570 to bond the plurality of nitride semiconductor layers 550 to the support substrate 570.

Figure 30:
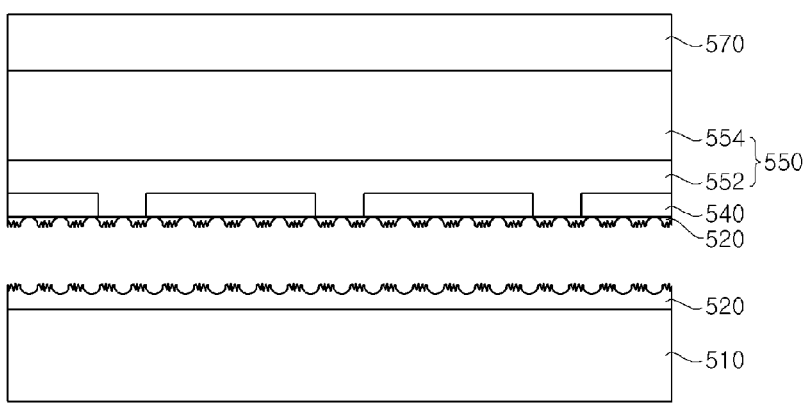

Referring to FIG. 30, a process of separating the growth substrate 510 from the nitride semiconductor layers 550 is performed.

In this embodiment, mechanical stress is applied to the sacrificial layer 520 having the plurality of cavities 560 and breakage is propagated along the cavities 560, whereby the sacrificial layer 520 can be separated as shown in FIG. 5, thereby separating the support substrate 570 from the growth substrate 510 and the nitride semiconductor layers 550.

Figure 31:
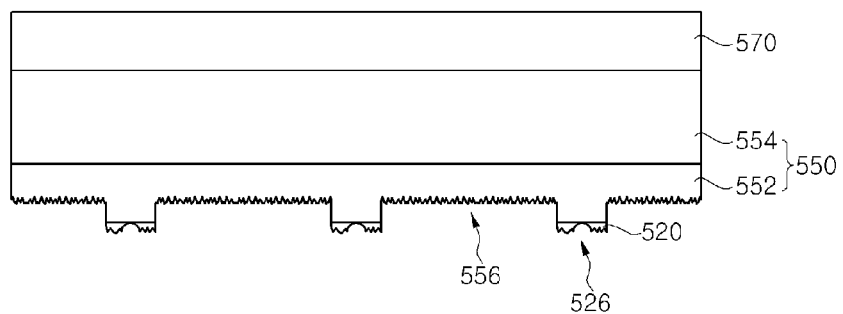

Referring to FIG. 31, a process of removing the insulation pattern 540 from the support substrate 570 having the nitride semiconductor layers 550 that has been separated from the growth substrate 510 is performed.

The sacrificial layer 520 may partially remain on the nitride semiconductor layers 550, specifically on the nitride semiconductor layers 550 and the insulation pattern 540, while the growth substrate 510 is separated. Further, as shown in FIG. 6, a portion of the sacrificial layer 520 grown on the nitride semiconductor layers 550 can remain when the insulation pattern 540 is removed using the process of removing the insulation pattern 540.

As shown in FIG. 5 and FIG. 6, a first surface 526, which is a portion of a surface of the remaining sacrificial layer 520, may be a rough surface. This is because the first surface 526 is formed when the inner surface of the cavities 560 or the surface of the sacrificial layer 520 broken by propagation of breakage is exposed.

In addition, as shown in FIG. 6, the second surface 556, which is a surface of the first nitride semiconductor layer 552 exposed by removing the insulation pattern 540, may be a rough surface. This is because the second surface 556 is exposed by removing the insulation pattern 540 and thus has a rough surface by the etching liquid for etching the insulation pattern 540.

The first surface 526 and the second surface 556 may have different roughness degrees. This is because the first surface 526 and the second surface 556 are formed in different layers and by different processes.

Figure 32:
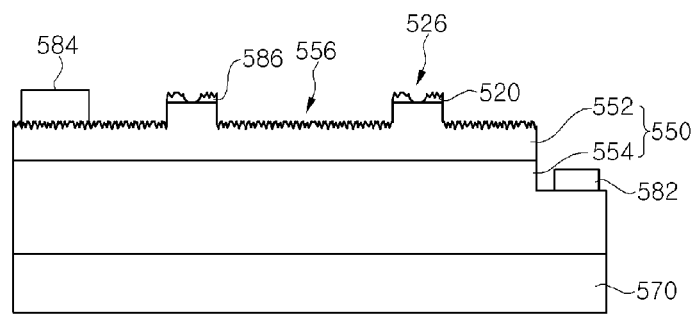

Referring to FIG. 32, the nitride semiconductor layers 550 on the support substrate 570 and a remaining portion of the sacrificial layer 520 on the nitride semiconductor layers 550 are used to fabricate a light emitting diode by the method of separating a growth substrate from a nitride semiconductor layer according to the embodiment described with reference to FIG. 26 to FIG. 31.

That is, the light emitting diode may be fabricated by mesa etching the remaining portion of the sacrificial layer 520 and the nitride semiconductor layers 550 such that a portion of the nitride semiconductor layers 550, for example, a portion of the first type semiconductor layer (not shown) of the second nitride semiconductor layer 554 can be exposed; forming a first electrode 582 on a portion of the first type semiconductor layer (not shown) of the exposed second nitride semiconductor layer 554 and a second electrode 584 on the nitride semiconductor layers 550; and dicing the support substrate 570 to form individual light emitting diodes.

In the light emitting diode, the convex-concave pattern 586 is formed on the surface of the nitride semiconductor layers 550 or on a portion of the surface of the remaining sacrificial layer 520 by the process of separating the growth substrate 510 or by the process of removing the insulation pattern 540, and these surfaces are rough, whereby the uppermost surface of the nitride semiconductor layers 550 on the support substrate 570 can have the convex-concave pattern 586 and rough surfaces 526 and 556.

Thus, when light is extracted through the surface on the nitride semiconductor layers 550, the light emitting diode has improved light extraction efficiency.

The separated growth substrate 510 may be reused after a cleaning process for removing a portion of the sacrificial layer 520 remaining on the surface thereof.

Figure 37:
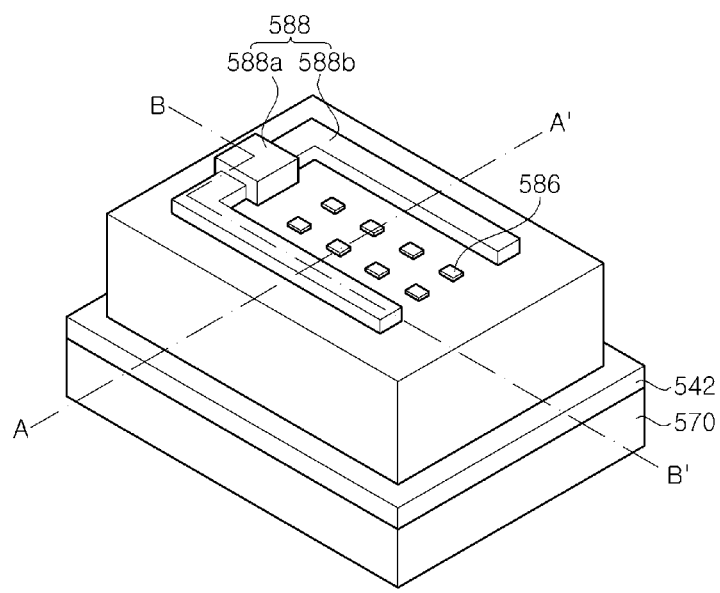
FIGS. 37 to 38 are a perspective view and a cross-sectional view of another example of a light emitting diode including a nitride semiconductor layer separated by the method of separating a growth substrate from a nitride semiconductor layer according to yet another embodiment of the present invention.
Figure 38:
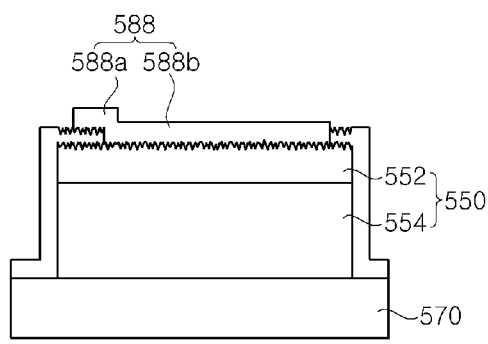

FIGS. 36 to 38 are a perspective view and cross-sectional views showing another example of the light emitting diode including the nitride semiconductor layer separated by the method of separating a growth substrate from a nitride semiconductor layer according to this embodiment of the invention.

FIG. 36 is a cross-sectional view taken along line A-A' of FIG. 37 and FIG. 38 is a cross-sectional view taken along line B-B' of FIG. 37.

Referring to FIG. 36, the nitride semiconductor layers 550 on the support substrate 570 and a remaining portion of the sacrificial layer 520 on the nitride semiconductor layers 550 are used to fabricate a light emitting diode by the method of separating a growth substrate from a nitride semiconductor layer according to this embodiment of the invention described with reference to FIG. 26 to FIG. 31.

That is, an interlayer insulation film 542 is formed on the support substrate 570 on which the nitride semiconductor layers 550 are formed.

The nitride semiconductor layers 550 may be divided into plural regions. The nitride semiconductor layers 550 may be divided by partially etching a portion of the nitride semiconductor layers 550 through mesa etching or the like to expose the support substrate 570.

In FIG. 36, side surfaces of the nitride semiconductor layers 550 are exposed by mesa etching and covered with the interlayer insulation film 542. However, when the nitride semiconductor layers 550 are not divided, the interlayer insulation film 542 may be disposed in the form of covering the top of the nitride semiconductor layers 550.

The interlayer insulation film 542 may have an opening 544. The opening 544 may be formed only in a region in which an electrode extension 588b described below will be formed.

The interlayer insulation film 542 may be provided to protect the nitride semiconductor layers 550 under the interlayer insulation film 542, in particular, to protect the uppermost first nitride semiconductor layer 552. Of course, the interlayer insulation film 542 may be omitted, as needed.

Referring to FIG. 37 and FIG. 38, an upper electrode portion 588 is formed on the support substrate 570 on which the interlayer insulation film 542 having the opening 544 is formed.

An upper electrode 588a of the upper electrode portion 588 is formed on the interlayer insulation film 542, and the electrode extension 588b is formed within the opening 544 of the interlayer insulation film 542.

Therefore, the electrode extension 588b is in direct contact with and electrically connected to the first nitride semiconductor layer 552, and the upper electrode 588a is electrically connected to the first nitride semiconductor layer 552 through the electrode extension 588b without direct contact.

At this time, the electrode extension 588b may be formed in singular or in plural. That is, in this embodiment, two electrode extensions 588b are formed, without being limited thereto. Alternatively, only one electrode extension or three or more electrode extensions 588b may be provided.

Then, the process of separating the support substrate 570 or the process of separating the nitride semiconductor layers 550 from the support substrate 570 is performed, thereby providing a plurality of light emitting diode chips, as shown in FIG. 37.

FIGS. 39 to 46 are cross-sectional views showing a method of separating a growth substrate from a nitride semiconductor layer according to yet another embodiment of the present invention.

Figure 47:
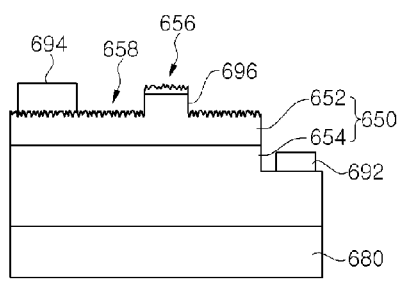
FIG. 47 is a cross-sectional view of one example of a light emitting diode including a nitride semiconductor layer separated by a method of separating a growth substrate from a nitride semiconductor layer according to yet another embodiment of the present invention.

FIG. 47 is a cross-sectional view of one example of a light emitting diode including a nitride semiconductor layer separated by the method of separating a growth substrate from a nitride semiconductor layer according to this embodiment of the invention.

Figure 48:
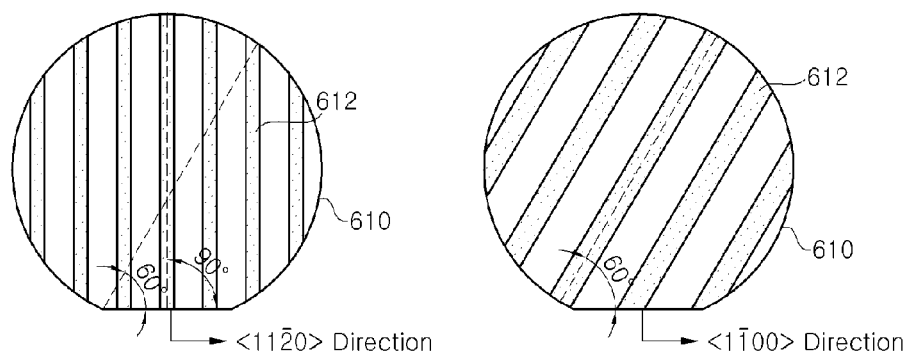
FIG. 48 is a conceptual view of examples of stripe patterns formed on one surface of a growth substrate.

FIG. 48 is a conceptual view of examples of stripe patterns formed on one surface of a growth substrate.

Figure 39:
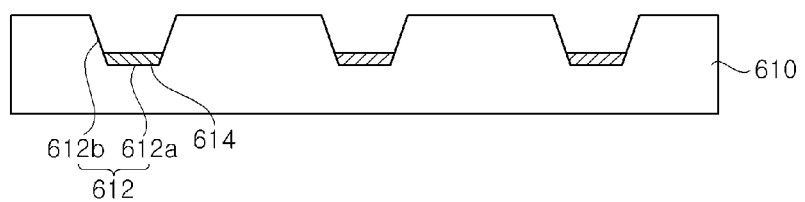
FIGS. 39 to 46 are cross-sectional views showing a method of separating a growth substrate from a nitride semiconductor layer according to yet another embodiment of the present invention.

Referring to FIG. 39, in the method of separating a growth substrate from the nitride semiconductor layer according to this embodiment, first, a growth substrate 610 is prepared.

Then, a stripe pattern 612 is formed on one surface of the growth substrate 610.

The stripe pattern 612 may be formed by etching one surface of the growth substrate 610 to a predetermined depth and forming grooves each having a bottom surface 612a and an inclined surface 612b.

The stripe pattern 612 may be formed by forming a mask pattern on one surface of the growth substrate 610, followed by dry etching.

When the growth substrate 610 is a sapphire substrate, the stripe pattern 612 is formed in a direction of 60 to 90 degrees with respect to the sapphire substrate, as shown in (a) of FIG. 48 (i.e. in a direction of 90 degrees in (a) of FIG. 23).

In addition, when the growth substrate 610 is a GaN substrate, the stripe pattern 612 is formed in a direction of 60 degrees with respect to the GaN substrate, as shown in (b) of FIG. 48.

This is because portions of a sacrificial layer 620 are grown from the surface of the growth substrate 610 at opposite sides of the stripe pattern 612 when the sacrificial layer 620 is epitaxially grown on the growth substrate 610 having the stripe pattern 612 formed thereon, and the portions of the grown sacrificial layer 620 are laterally grown and merged into one layer to thereby form the sacrificial layer 620. That is, the sacrificial layers 620 are well merged when the stripe pattern 612 is formed in the foregoing direction.

Then, a growth control layer 614 is formed on a bottom surface 612a of the stripe pattern 612. When the sacrificial layer 620 is grown on the growth substrate 610, the sacrificial layer 620 may be grown on the bottom surface 612a of the stripe pattern 612 instead of being grown on the inclined surface 612b of the stripe pattern 612. Thus, the growth control layer 614 prevents growth of the sacrificial layer 620 on the bottom surface 612a.

The growth control layer 614 may include an insulation material such as silicon oxide, silicon nitride, and the like.

Figure 40:
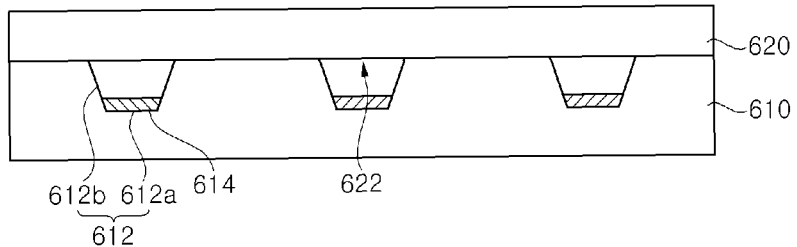

Referring to FIG. 40, the sacrificial layer 620 is grown on the growth substrate 610 having the stripe pattern 612 formed thereon.

The sacrificial layer 620 is epitaxially grown after placing the growth substrate 610 into a chamber of an epitaxial growth system such as an MOCVD system. The sacrificial layer 620 may include GaN doped with impurities, preferably n-GaN highly doped with n-type impurities.

When the sacrificial layer 620 is formed, growth conditions of the sacrificial layer 620, such as a flow rate of injected gas, growth temperature, growth pressure, or the like, are controlled such that a partial surface 622 of the sacrificial layer 620 formed on the growth control layer 614 can be uniform. When the partial surface 622 of the sacrificial layer 620 is not uniform while the sacrificial layer 620 is laterally grown, the sacrificial layer 620 can be non-uniformly etched, thereby making it difficult to separate the growth substrate 610.

In this embodiment, the growth control layer 614 serves to prevent growth of the stripe pattern 612 on the bottom surface 612a when the stripe pattern 612 is formed by dry etching. However, when the bottom surface 612a has a convex-concave pattern, or when the bottom surface 612a of the stripe pattern 612 is deep, there is no need to form the growth control layer 614.

In formation of the sacrificial layer 620, when the bottom surface 612a has a convex-concave pattern, growth does not occur on the bottom surface 612a. Further, when the bottom surface 612a is deep, growth does not usually occur and does not affect sacrificial layer 620 even when the growth occurs.

Figure 41:
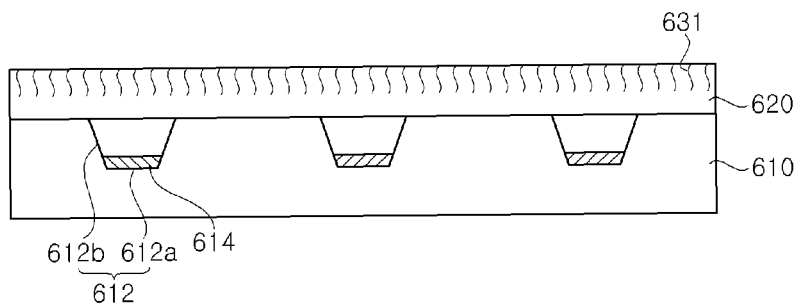

Referring to FIG. 41, a plurality of fine pores 631 is formed within the sacrificial layer 620.

The fine pores 631 may be formed to have the same shape as the fine pores 531 including the first fine pores 532 and the second fine pores 534 described with reference to FIG. 27, FIG. 33 and FIG. 34. Therefore, repetitive descriptions thereof will be omitted.

Figure 42:
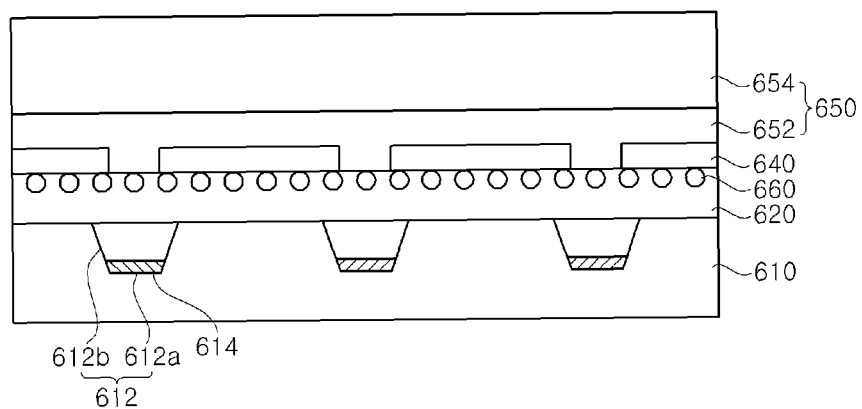

Referring to FIG. 42, an insulation pattern 640 is formed on the sacrificial layer 620.

The insulation pattern 640 may include an insulation material such as silicon oxide, silicon nitride, or the like.

The insulation pattern 640 may have open regions in the form of a stripe or mesh pattern.

Then, a plurality of nitride semiconductor layers 650 is formed on the sacrificial layer 620 having the insulation pattern 640 formed thereon.

The plurality of nitride semiconductor layers 650 may be formed through regrowth by placing the growth substrate 610 again into the chamber of the epitaxial growth system such as an MOCVD system.

That is, the plurality of nitride semiconductor layers 650 may be epitaxially grown from the surface of the sacrificial layer 620 exposed through the open regions of the insulation pattern 640.

In this case, the fine pores 631 of the sacrificial layer 620 may form a plurality of cavities 660 when the plurality of nitride semiconductor layers 650 are formed by epitaxial growth.

The plurality of cavities 660 may be formed by merging the plurality of fine pores 531 into one, or by expanding one fine pore 631.

When the plurality of nitride semiconductor layers 650 is epitaxially grown, the size, position, number, or the like of cavities 660 may be adjusted by controlling the growth temperature for epitaxial growth, or the kind and flow rate of injected gas.

The cavities 660 are generally formed in an upper region of the sacrificial layer 620 (here, the upper region of the sacrificial layer 620 refers to a region close to an interface adjoining the plurality of nitride semiconductor layers 650).

The cavities 660 may be formed to be larger in a distant region of the sacrificial layer 620 from the plurality of nitride semiconductor layers 650 than a close region thereof, and may be formed to become larger with increasing distance from the plurality of nitride semiconductor layers 650.

FIG. 42 shows the nitride semiconductor layers 650 that include a first nitride semiconductor layer 652 and a second nitride semiconductor layer 654, without being limited thereto. Alternatively, the nitride semiconductor layer may be composed of a single layer, or may be composed of three or more layers.

The first nitride semiconductor layer 652 may be a buffer layer and the second nitride semiconductor layer 654 may be a semiconductor layer including at least an active layer.

That is, the first nitride semiconductor layer 652 may be an n-GaN layer doped with n-type impurities or a μ-GaN layer doped with no impurity.

The second nitride semiconductor layer 654 may include a first type semiconductor layer (not shown), an active layer (not shown) and a second type semiconductor layer (not shown). In addition, the second nitride semiconductor layer 654 may further include a super-lattice layer (not shown) or an electron blocking layer (not shown).

The first type semiconductor layer (not shown), the active layer (not shown), the second type semiconductor layer (not shown), the super-lattice layer (not shown) and the electron blocking layer (not shown) have been described in detail in the foregoing embodiments, and thus repetitive descriptions thereof will be omitted.

Figure 43:
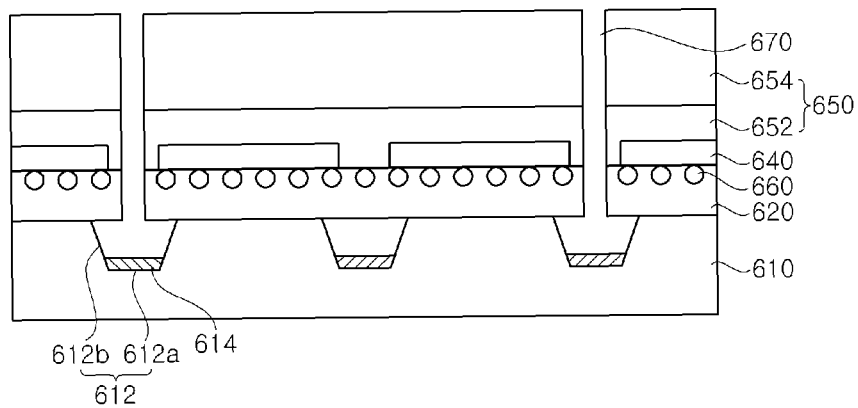
Figure 44:
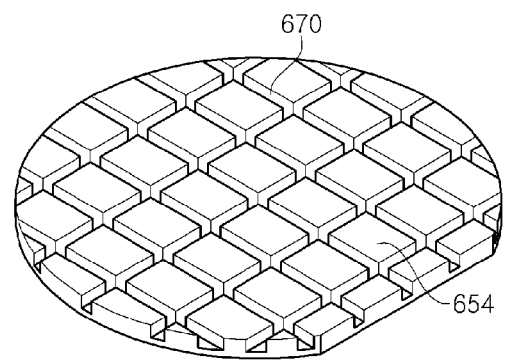

Referring to FIG. 43 and FIG. 44, mesa etching is performed with respect to at least the nitride semiconductor layer 650, thereby forming mesa lines 670.

The mesa lines 670 serve to guide an etching liquid for etching the sacrificial layer 620 and are connected to at least the sacrificial layer 620.

In this embodiment, since the stripe pattern 612 is formed on one surface of the growth substrate 610, the mesa lines 670 may be connected up to the cavities 660 and the stripe pattern 612 by etching the nitride semiconductor layers 650 and the sacrificial layer 620.

Alternatively, when the stripe pattern 612 is not formed on the growth substrate 610, the mesa lines 670 may be provided so as to be connected up to the cavities 660 of the sacrificial layer 620.

The mesa lines 670 may be formed throughout the growth substrate 610, as shown in FIG. 44.

That is, in a plan view of the growth substrate 610, the mesa lines 670 may be formed from one end to the other end. The mesa lines 670 may be disposed in the form of a stripe pattern repeatedly arranged on the growth substrate 610 in a vertical or horizontal direction.

In addition, the mesa lines 670 are repeatedly arranged on the growth substrate 610 in the vertical and horizontal directions such that the vertical mesa lines 670 and the horizontal mesa lines 670 intersect each other to form a mesh pattern (see FIG. 19).

The mesa lines 670 may be formed to intersect the stripe pattern 612. That is, the direction of the mesa line 670 may be formed not to be parallel to the direction of the stripe pattern 612.

This configuration serves to connect more mesa lines 670 with the stripe pattern 612, whereby the etching liquid injected through the mesa lines 670 can be evenly injected to the surface of the growth substrate 610.

Figure 45:
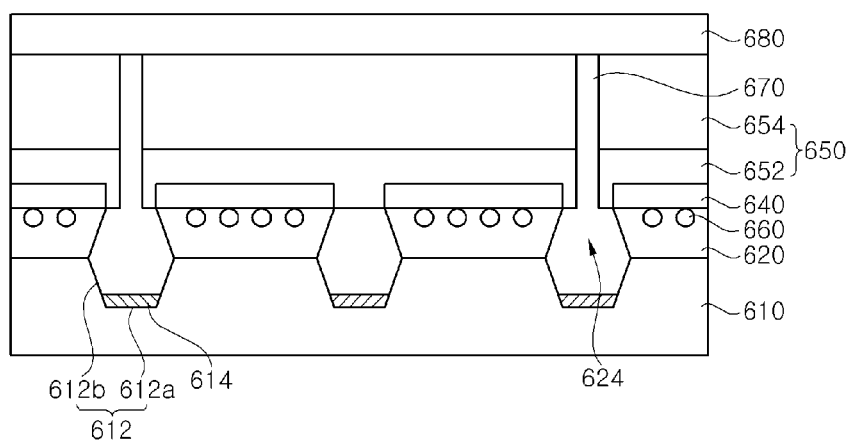

Referring to FIG. 45, a support substrate 680 is attached to the plurality of nitride semiconductor layers 650.

The support substrate 680 may include a sapphire substrate, a GaN substrate, a glass substrate, a silicon carbide substrate or a silicon substrate; a conductive substrate formed of metallic materials; a circuit substrate such as a printed circuit board (PCB) or the like; and a ceramic substrate containing ceramic.

Although not shown in FIG. 45, a bonding layer (not shown) may be disposed between the plurality of nitride semiconductor layers 650 and the support substrate 670 to bond the plurality of nitride semiconductor layers 650 to the support substrate 670.

Then, a process of separating the growth substrate 610 from the nitride semiconductor layers 650 is performed.

The separation process may be performed by injecting an etching liquid through the mesa lines 670 and etching the sacrificial layer 620.

The etching liquid is injected into the stripe pattern 612 through the mesa lines 670, and thus a certain region 624 of the sacrificial layer 620 placed on the stripe pattern 612 is first etched. At this time, the certain region 624 of the sacrificial layer 620 to be etched may have a trapezoidal cross-section. Thus, when the insulation pattern 640 is formed, an open region may be properly determined in consideration of the trapezoidal etching region of the sacrificial layer 620.

At this time, the etching liquid may include NaOH and $H_2O_2$. The etching liquid may include NaOH:$H_2O_2$:ultrapure water in a ratio of 80:80:300 (cc).

Etching is performed for 30 minutes at a temperature of 60 degrees, whereby the sacrificial layer 620 can be etched and separated. At this time, the sacrificial layer 620 includes the cavities 660 and thus can be more easily etched by the etching liquid.

The separation process may be modified. That is, etching may be finished without completely separating the sacrificial layer 620 by a method of shortening an etching time, and a process of applying mechanical stress to the sacrificial layer 620 may be additionally performed to separate the growth substrate 610, thereby performing the separation process.

Figure 46:
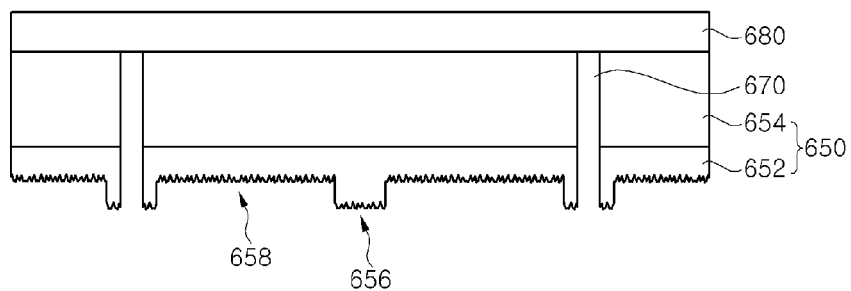

Referring to FIG. 46, a process of removing the insulation pattern 640 is performed after separating the growth substrate 610 from the nitride semiconductor layer 650.

When the insulation pattern 640 includes silicon oxide, buffered oxide etchant (BOE) may be used to remove the insulation pattern 640.

The surface of the nitride semiconductor layers 550 may be formed to have a convex-concave pattern by removing the insulation pattern 640, and may become rough by the etching liquid for etching the sacrificial layer 620, BOE for etching the insulation pattern 640, and the like.

After removing the insulation pattern 640, another process may be performed by dipping the separated surface into a solution containing HCl, NaOH or a mixture of $H_2SO_4$ and $H_2O_2$ in order to remove a metallic material, for example, metallic Ga.

FIG. 45 and FIG. 46 show the process of etching the sacrificial layer 620 using the etching liquid and the process of removing the insulation pattern 640 by etching the insulation pattern 640 using BOE after separating the growth substrate 610. However, the insulation pattern 640 may be etched through the stripe pattern 612 and the cavities 660 by injecting BOE into the mesa line 670 instead of the etching liquid, whereby the support substrate 610 can be separated from the nitride semiconductor layer 650 while removing the insulation pattern 640.

A third surface 656, which is a surface of the first nitride semiconductor layer 652 exposed by etching the certain region 624 of the sacrificial layer 620 with the etching liquid, is formed to be rough, as shown in FIG. 21. The third surface 656 is formed by partially etching the surface of the first nitride semiconductor layer 652 by the etching liquid.

In addition, a fourth surface 658, which is a surface of the first nitride semiconductor layer 625 exposed by removing the insulation pattern 640, is formed to be rough, as shown in FIG. 21. The fourth surface 658 is a surface exposed by removing the insulation pattern 640 and thus has a rough surface by the etching liquid that etches the insulation pattern 640.

The third surface 656 and the fourth surface 658 may have different roughness degrees. This is because the third surface 656 and the fourth surface 658 are formed by different processes.

Referring to FIG. 47, a light emitting diode is fabricated using the nitride semiconductor layers 650 formed on the support substrate 680 by the method of separating a growth substrate from a nitride semiconductor layer according to this embodiment of the invention described with reference to FIG. 39 to FIG. 46.

That is, the light emitting diode may be fabricated by mesa etching the nitride semiconductor layers 650 such that a portion of the nitride semiconductor layers 650, for example, a portion of the first type semiconductor layer (not shown) of the second nitride semiconductor layer 654 can be exposed; forming a first electrode 692 on a portion of the first type semiconductor layer (not shown) of the exposed second nitride semiconductor layer 554 and a second electrode 694 on the nitride semiconductor layers 650; and dicing the support substrate 680 to form individual light emitting diodes.

In the light emitting diode, the surface of the nitride semiconductor layer 650 is formed to have a convex-concave pattern 696 and to be rough by the process of separating the growth substrate 610 or by the process of removing the insulation pattern 640, whereby the uppermost surface of the nitride semiconductor layers 650 on the support substrate 680 can have the convex-concave pattern 696 and rough surfaces 656, 258. Thus, when light is extracted through the uppermost surface of the nitride semiconductor layers 650, the light emitting diode has improved light extraction efficiency.

The separated growth substrate 610 may be reused after a cleaning process for removing a portion of the sacrificial layer 620 remaining on the surface thereof.

Figure 49:
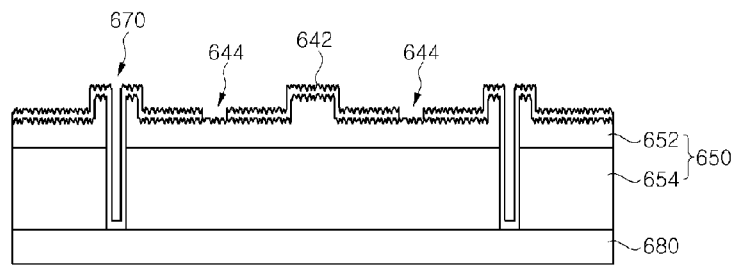
FIGS. 49 to 51 are a perspective view and cross-sectional views showing another example of a light emitting diode including a nitride semiconductor layer separated by a method of separating a growth substrate from a nitride semiconductor layer according to yet another embodiment of the present invention.
Figure 50:
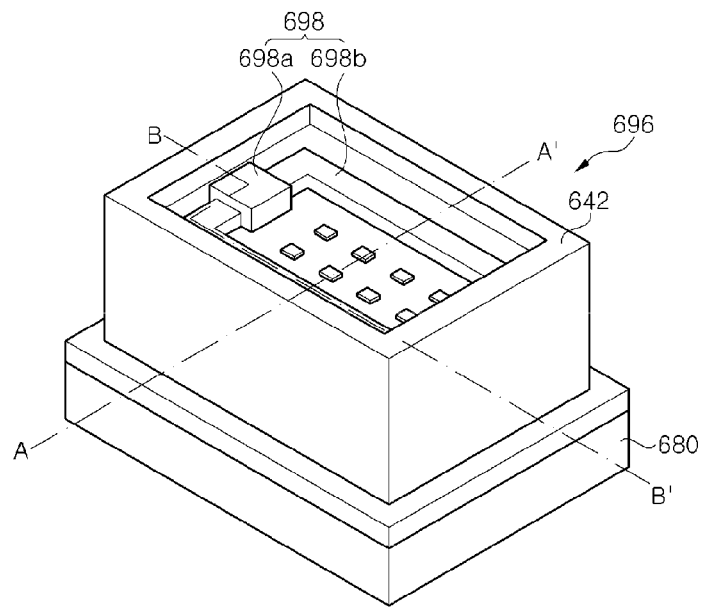
Figure 51:
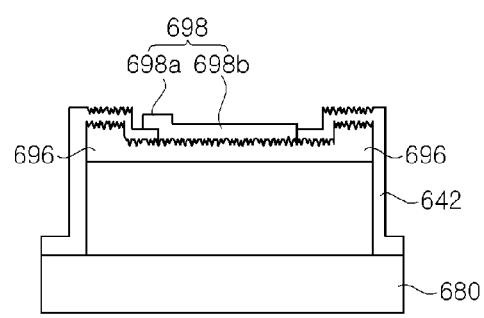

FIGS. 49 to 51 are a perspective view and cross-sectional views showing another example of the light emitting diode including the nitride semiconductor layer separated by the method of separating a growth substrate from a nitride semiconductor layer according to this embodiment of the invention.

FIG. 49 is a cross-sectional view taken along line A-A' of FIG. 50 and FIG. 51 is a cross-sectional view taken along line B-B' of FIG. 50.

Referring to FIG. 49, the nitride semiconductor layers 650 on the support substrate 680 are used to fabricate a light emitting diode by the method of separating a growth substrate from a nitride semiconductor layer according to the embodiment of the invention described with reference to FIG. 39 to FIG. 46.

That is, an interlayer insulation film 642 is formed on the support substrate 680 on which the nitride semiconductor layers 650 are formed.

The nitride semiconductor layers 650 may be formed on the support substrate 680 in a state of being divided into plural regions by the mesa lines 670.

The interlayer insulation film 642 may have an opening 644. The opening 644 may be formed only in a region where an electrode extension 698b described below will be formed.

The interlayer insulation film 642 may be provided to protect the nitride semiconductor layers 650 under the interlayer insulation film 642, in particular, to protect the uppermost first nitride semiconductor layer 652. Of course, the interlayer insulation film 642 may be omitted, as needed.

Referring to FIG. 50 and FIG. 51, an upper electrode portion 698 is formed on the support substrate 680 on which the interlayer insulation film 642 having the opening 644 is formed.

An upper electrode 698a of the upper electrode portion 698 is formed on the interlayer insulation film 642, and the electrode extension 698b is formed within the opening 644 of the interlayer insulation film 642.

Therefore, the electrode extension 698b is in direct contact with and electrically connected to the first nitride semiconductor layer 652, and the upper electrode 698a is electrically connected to the first nitride semiconductor layer 652 through the electrode extension 698b without direct contact.

At this time, singular or plural electrode extension 698b may be formed. That is, in this embodiment, two electrode extensions 698b are formed, without being limited thereto. Alternatively, only one electrode extension or three or more electrode extensions 698b may be provided.

Then, the process of separating the support substrate 680 is performed, thereby providing a plurality of light emitting diode chips, as shown in FIG. 25.

Figure 52:
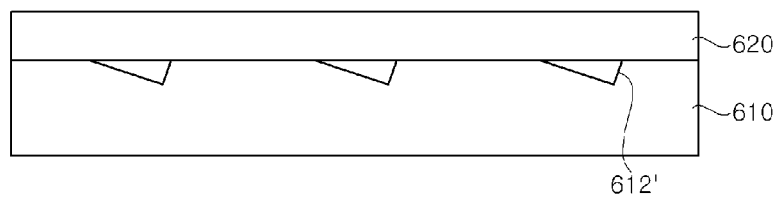
FIG. 52 is a cross-sectional view showing a method of separating a growth substrate from a nitride semiconductor layer according to yet another embodiment of the present invention.

FIG. 52 is a cross-sectional view showing a method of separating a growth substrate from a nitride semiconductor layer according to yet another embodiment of the present invention.

Referring to FIG. 52, the method of separating a growth substrate from a nitride semiconductor layer according to this embodiment is the same as the separation method described with reference to FIG. 39 to FIG. 46, except that one surface of a growth substrate 610 is provided with a stripe pattern 612' having a different cross-section.

The stripe pattern 612' substantially has a V-shaped cross-section, one surface of which is less inclined to have a long inclined surface.

The stripe pattern 612' may be formed by etching the growth substrate 610 through wet-etching. That is, the stripe pattern 612' may be formed by crystallographic characteristics of the growth substrate 610.

When the growth substrate 610 is a sapphire substrate having c-plane (0001) and is wet etched to form the stripe pattern 612', other surfaces of the stripe pattern 612' are exposed except for the c-plane, i.e. (0001) plane, on which the sacrificial layer 620 is grown.

As compared with the method of separating a growth substrate from a nitride semiconductor layer described with reference to FIG. 39 to FIG. 46, the c-plane of the inclined surfaces of the stripe pattern 612' according to this embodiment of the invention is not exposed and thus growth does not occur on the inclined surfaces of the stripe pattern 612'. Therefore, the stripe pattern 612' does not require the growth control layer.

Accordingly, the method of separating a growth substrate from a nitride semiconductor layer according to this embodiment of the invention includes the same process of growing the sacrificial layer 620 on the growth substrate 610 as the method of separating a growth substrate from a nitride semiconductor layer described with reference to FIGS. 39 and 46, except that the stripe pattern 612' is formed on one surface of the growth substrate 610. Therefore, repetitive descriptions thereof will be omitted.

FIGS. 53 to 58 are cross-sectional views showing a method of separating a growth substrate from a nitride semiconductor layer according to yet another embodiment of the present invention.

Figure 59:
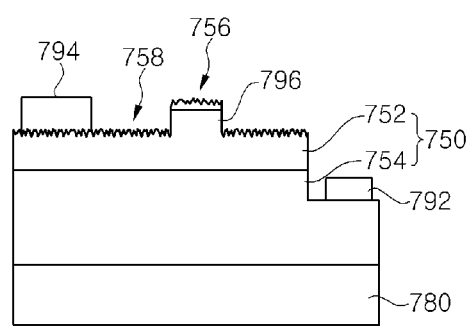
FIG. 59 is a cross-sectional view of one example of a light emitting diode including a nitride semiconductor layer separated by a method of separating a growth substrate from a nitride semiconductor layer according to yet another embodiment of the present invention.

FIG. 59 is a cross-sectional view of one example of a light emitting diode including a nitride semiconductor layer separated by the method of separating a growth substrate from a nitride semiconductor layer according to this embodiment of the invention.

Figure 53:
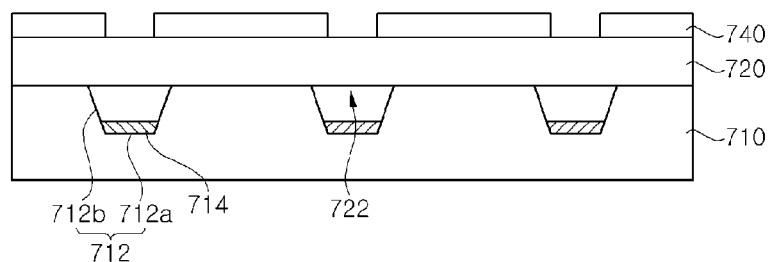
FIGS. 53 to 58 are cross-sectional views showing a method of separating a growth substrate from a nitride semiconductor layer according to yet another embodiment of the present invention.

Referring to FIG. 53, in the method of separating a growth substrate from the nitride semiconductor layer according to this embodiment, first, a growth substrate 710 is prepared.

Then, a stripe pattern 712 is formed on one surface of the growth substrate 710.

The stripe pattern 712 may be formed by etching one surface of the growth substrate 710 to a predetermined depth and forming grooves each having a bottom surface 712a and an inclined surface 712b.

The stripe pattern 712 may be formed by forming a mask pattern on one surface of the growth substrate 710, followed by dry etching.

At this time, although not shown in FIG. 53, the stripe pattern 712 may be replaced by the stripe pattern 612' formed by wet etching described with reference to FIG. 27.

The stripe pattern 712 is the same as the stripe pattern 612 provided according to the foregoing embodiment of the invention, and thus repetitive descriptions thereof will be omitted.

Then, a growth control layer 714 is formed on the bottom surface 712a of the stripe pattern 712. The growth control layer 714 is the same as the growth control layer 614 provided according to the foregoing embodiment of the invention, and thus repetitive descriptions thereof will be omitted.

Then, a sacrificial layer 720 is grown on the growth substrate 710 having the stripe pattern 712 formed thereon.

When the sacrificial layer 720 is formed, growth conditions of the sacrificial layer 620, such as a flow rate of injected gas, growth temperature, growth pressure, or the like, are controlled such that a partial surface 722 of the sacrificial layer 720 formed on the growth control layer 714 can be uniform. When the partial surface 722 of the sacrificial layer 720 is not uniform while the sacrificial layer 720 is laterally grown, the sacrificial layer 720 can be non-uniformly etched, thereby making it difficult to separate the growth substrate 710.

The sacrificial layer 720 is the same as the sacrificial layer 620 described in the foregoing embodiment, and thus repetitive descriptions thereof will be omitted.

Then, an insulation pattern 740 is formed on the sacrificial layer 720.

The insulation pattern 740 may serve to control the forming position or direction of fine pores 731 while forming the fine pores 731, as described below.

The insulation pattern 740 is formed to have a proper surface, thereby enabling good surface reformation of the nitride semiconductor layer 752 formed on the insulation pattern 740.

The insulation pattern 740 may include an insulation material such as silicon oxide, or silicon nitride, etc.

The insulation pattern 740 may have open regions in the form of a stripe or mesh pattern.

Figure 54:
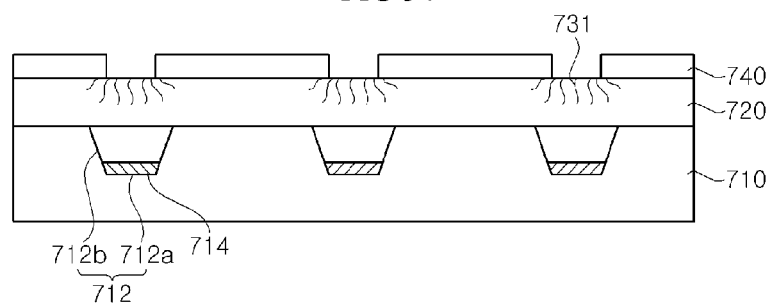

Referring to FIG. 54, a plurality of fine pores 731 are formed within the sacrificial layer 720.

The fine pores 731 may be formed to a predetermined depth from the surface of the sacrificial layer 720 exposed through the insulation pattern 740. That is, as shown in FIG. 29, the fine pores 731 may be formed not only under regions where the sacrificial layer 720 is exposed, but also under an edge of the insulation pattern 740.

This is because the fine pores 731 are formed not only in a direction perpendicular to the surface of the sacrificial layer 720 but also in a direction not perpendicular to the surface of the sacrificial layer 720, i.e. in an oblique direction.

The fine pores 731 may be formed to have the same shape as the fine pores 531 including the first fine pores 532 and the second fine pores 534 described with reference to FIG. 27, FIG. 34 and FIG. 35.

Therefore, repetitive descriptions of the process of forming the fine pores 731 will be omitted.

Figure 55:
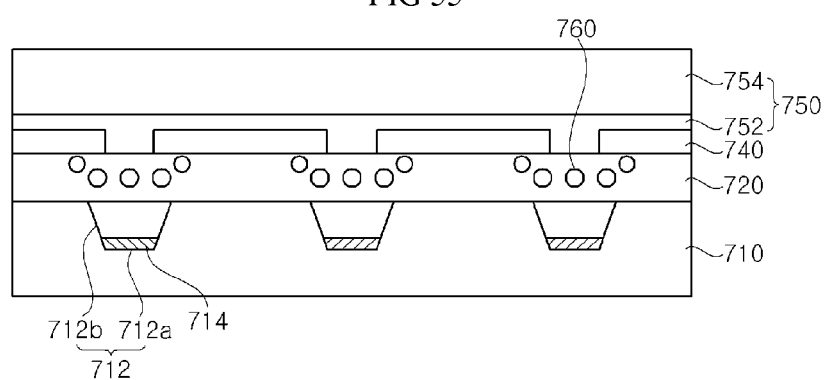

Referring to FIG. 55, a plurality of nitride semiconductor layers 750 are formed on the sacrificial layer 720 having the insulation pattern 740 formed thereon.

The plurality of nitride semiconductor layers 750 may be formed through regrowth by placing the growth substrate 710 again into the chamber of the epitaxial growth system such as an MOCVD system.

That is, the plurality of nitride semiconductor layers 750 may be grown from the surface of the sacrificial layer 720 exposed through the open regions of the insulation pattern 740.

In this case, the fine pores 731 of the sacrificial layer 720 may form a plurality of cavities 760 when the plurality of nitride semiconductor layers 750 are grown.

The plurality of cavities 760 may be formed by merging the plurality of fine pores 731 into one, or by expanding one fine pore 731.

When the plurality of nitride semiconductor layer 750 are epitaxially grown, the size, position, number, or the like of cavities 760 may be adjusted by controlling the growth temperature for epitaxial growth, or the kind and flow rate of injected gas.

As shown in FIG. 55, the cavities 760 may be arranged substantially in a U shape throughout a certain region of the sacrificial layer 720 exposed through the insulation pattern 740 and a certain region of the sacrificial layer 720 under the edge of the insulation pattern 740. This is because the fine pores 731 are formed not only in a direction perpendicular to one surface of the sacrificial layer 720 but also in an oblique direction, and thus the cavities 760 are formed in a similar form.

FIG. 55 shows the nitride semiconductor layers 750 that include a first nitride semiconductor layer 752 and a second nitride semiconductor layer 754, without being limited thereto. Alternatively, the nitride semiconductor layer may be composed of a single layer, or may be composed of three or more layers.

The plurality of nitride semiconductor layers 750 including the first nitride semiconductor layer 752 and the second nitride semiconductor layer 754 according to this embodiment are the same as the plurality of nitride semiconductor layers 650 including the first nitride semiconductor layer 652 and the second nitride semiconductor layer 654 provided according to the foregoing embodiment, and thus repetitive descriptions thereof will be omitted.

Figure 56:
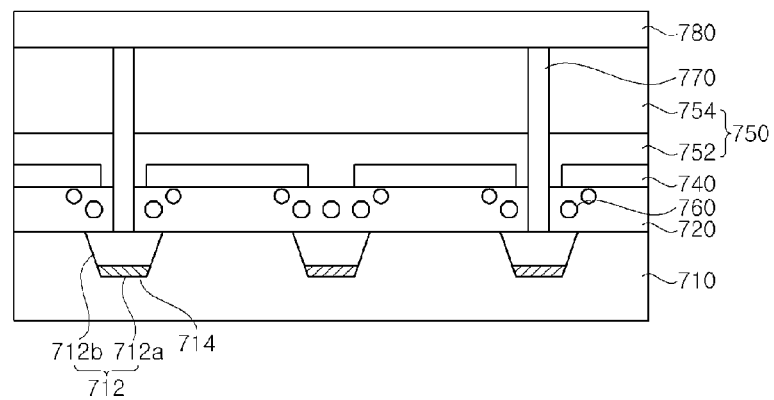

Referring to FIG. 56, mesa etching is performed with respect to at least the nitride semiconductor layer 750, thereby forming mesa lines 770.

The mesa lines 770 serve to guide an etching liquid for etching the sacrificial layer 720 and are connected to at least the sacrificial layer 620.

In this embodiment, the stripe pattern 712 is formed on one surface of the growth substrate 710, the mesa lines 770 may be connected up to the cavities 760 and the stripe pattern 712 by etching the nitride semiconductor layers 750 and the sacrificial layer 720.

Alternatively, when the stripe pattern 712 is not formed on the growth substrate 710, the mesa lines 770 may be provided so as to be connected up to the cavities 760 of the sacrificial layer 720.

The mesa line 770 is the same as the mesa line 670 provided according to the foregoing embodiment, and thus repetitive descriptions thereof will be omitted.

Then, a support substrate 780 is attached to the plurality of nitride semiconductor layers 750.

The support substrate 780 may include a sapphire substrate, a GaN substrate, a glass substrate, a silicon carbide substrate or a silicon substrate; a conductive substrate formed of metallic materials; a circuit substrate such as a printed circuit board (PCB) or the like; and a ceramic substrate containing ceramic.

Although not shown in FIG. 56, a bonding layer (not shown) may be disposed between the plurality of nitride semiconductor layers 750 and the support substrate 780 to bond the plurality of nitride semiconductor layers 750 to the support substrate 780.

Figure 57:
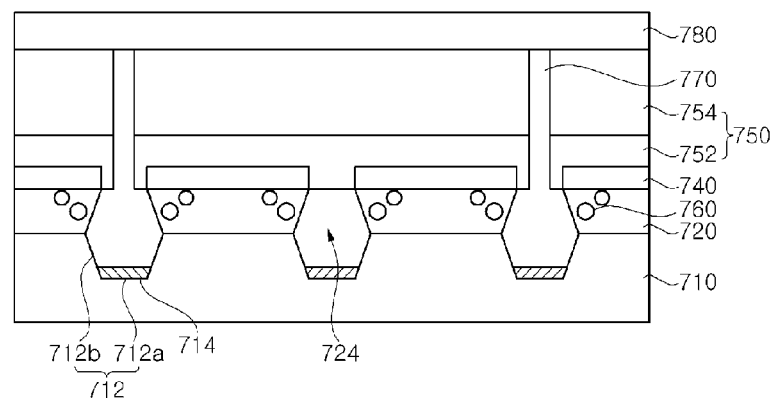

Referring to FIG. 57, a process of separating the growth substrate 710 from the nitride semiconductor layers 750 is performed.

The separation process may be formed by injecting an etching liquid through the mesa lines 770 and etching the sacrificial layer 720.

The etching liquid is injected into the stripe pattern 712 through the mesa lines 770, and thus a certain region 724 of the sacrificial layer 720 placed on the stripe pattern 712 is first etched. At this time, the certain region 724 of the sacrificial layer 720 to be etched may have a trapezoidal cross-section. Thus, when the insulation pattern 740 is formed, an open region is properly formed in consideration of the trapezoidal etching region of the sacrificial layer 720.

The process of separating the growth substrate 710 using the etching liquid to etch the sacrificial layer 720 has been described in the foregoing embodiment in detail with reference to FIG. 45, and thus repetitive descriptions thereof will be omitted.

Figure 58:
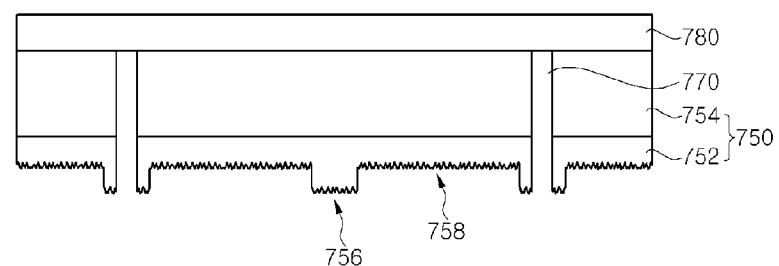

Referring to FIG. 58, a process of removing the insulation pattern 740 is performed after separating the growth substrate 710 from the nitride semiconductor layer 750.

The process of removing the insulation pattern 740 and alternative examples of removing the sacrificial layer 720 and the insulation pattern 740 are described in detail in the foregoing embodiments with reference to FIG. 46, and thus repetitive descriptions thereof will be omitted.

After removing the insulation pattern 740, another process may be performed by dipping the separated surface into a solution containing HCl, NaOH or a mixture of $H_2SO_4$ and $H_2O_2$ in order to remove a metallic material, for example, metallic Ga.

A fifth surface 756, which is a surface of the first nitride semiconductor layer 752 exposed by etching the certain region 724 of the sacrificial layer 720 with the etching liquid, is formed to be rough, as shown in FIG. 57. The fifth surface 756 is formed by partially etching the surface of the first nitride semiconductor layer 752 with the etching liquid.

In addition, a sixth surface 758, which is a surface of the first nitride semiconductor layer 725 exposed by removing the insulation pattern 740, is formed to be rough, as shown in FIG. 58. The sixth surface 758 is a surface exposed by removing the insulation pattern 740 and thus has a rough surface by the etching liquid that etches the insulation pattern 740.

The fifth source 756 and the sixth surface 758 may have different roughness degrees. This is because the fifth surface 756 and the sixth surface 758 are formed by different processes.

Referring to FIG. 59, a light emitting diode is fabricated using the nitride semiconductor layers 750 formed on the support substrate 780 by the method of separating a growth substrate from a nitride semiconductor layer according to this embodiment of the invention described with reference to FIG. 53 to FIG. 58.

That is, the light emitting diode may be fabricated by mesa etching the nitride semiconductor layers 750 such that a portion of the nitride semiconductor layers 750, for example, a portion of the first type semiconductor layer (not shown) of the second nitride semiconductor layer 754 can be exposed; forming a first electrode 792 on a portion of the first type semiconductor layer (not shown) of the exposed second nitride semiconductor layer 754 and a second electrode 794 on the nitride semiconductor layers 750; and dicing the support substrate 780 to form individual light emitting diodes.

In the light emitting diode, the surface of the nitride semiconductor layers 7350 is formed to have a convex-concave pattern 796 and to be rough by the process of separating the growth substrate 710 or by the process of removing the insulation pattern 740, whereby the uppermost surface of the nitride semiconductor layers 750 on the support substrate 780 can have the convex-concave pattern 796 and rough surfaces 756 and 358. Thus, when light is extracted through the surface on the nitride semiconductor layers 750, the light emitting diode has improved light extraction efficiency.

The separated growth substrate 710 may be reused after a cleaning process of removing a portion of the sacrificial layer 720 remaining on the surface thereof.

Figure 60:
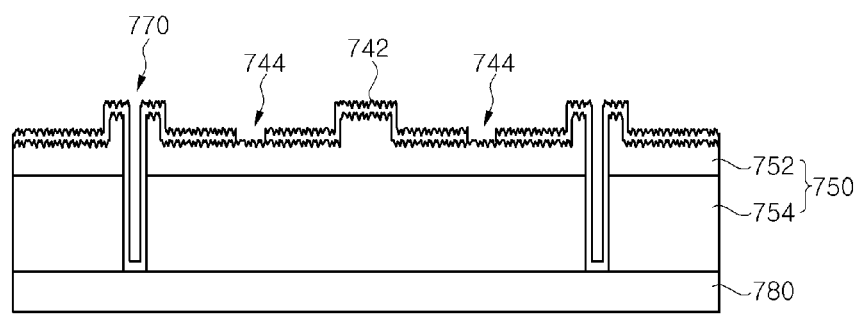
FIGS. 60 to 62 are a perspective view and cross-sectional views showing another example of a light emitting diode including a semiconductor layer separated by a method of separating a growth substrate from a nitride semiconductor layer according to yet another embodiment of the present invention.
Figure 61:
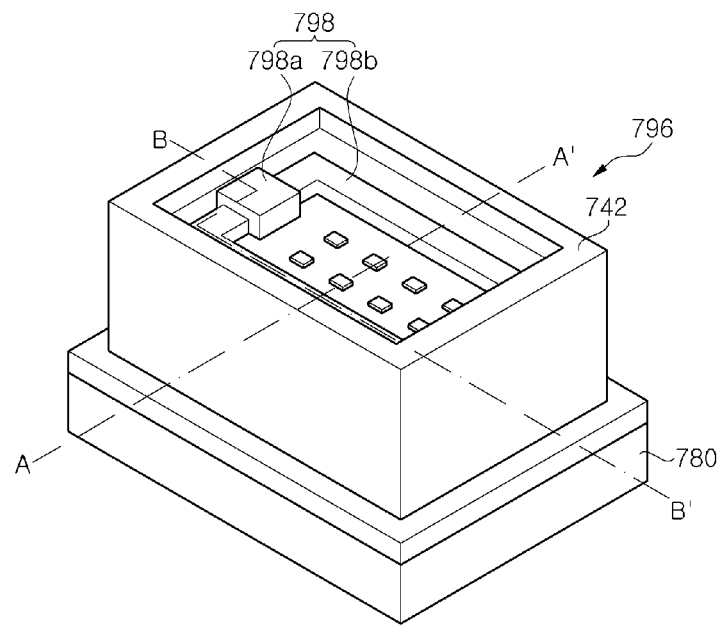
Figure 62:
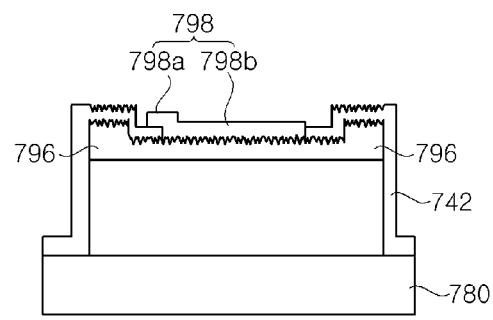

FIGS. 60 to 62 are a perspective view and cross-sectional views showing another example of the light emitting diode including the semiconductor layer separated by the method of separating a growth substrate from a nitride semiconductor layer according to this embodiment of the invention.

At this time, FIG. 60 is a cross-sectional view taken along line A-A' of FIG. 61, and FIG. 62 is a cross-sectional view taken along line B-B' of FIG. 61.

Referring to FIG. 60, the nitride semiconductor layers 750 on the support substrate 780 are used to fabricate a light emitting diode by the method of separating a growth substrate from a nitride semiconductor layer according to this embodiment of the invention described with reference to FIG. 53 to FIG. 58.

That is, an interlayer insulation film 742 is formed on the support substrate 780 on which the nitride semiconductor layers 750 are formed.

The nitride semiconductor layers 750 may be formed on the support substrate 780 in a state of being divided into plural regions by the mesa lines 770.

The interlayer insulation film 742 may have an opening 744. The opening 744 may be formed only in a region where an electrode extension 698b described below will be formed.

The interlayer insulation film 742 may be provided to protect the nitride semiconductor layers 750 under the interlayer insulation film 742, in particular, to protect the uppermost first nitride semiconductor layer 752. Of course, the interlayer insulation film 742 may be omitted, as needed.

Referring to FIG. 61 and FIG. 62, an upper electrode portion 798 is formed on the support substrate 780 on which the interlayer insulation film 742 having the opening 744 is formed.

An upper electrode 798a of the upper electrode portion 798 is formed on the interlayer insulation film 742, and the electrode extension 798b is formed within the opening 744 of the interlayer insulation film 742.

Therefore, the electrode extension 798b is in direct contact with and electrically connected to the first nitride semiconductor layer 752, and the upper electrode 798a is electrically connected to the first nitride semiconductor layer 752 through the electrode extension 798b without direct contact.

At this time, singular or plural electrode extension 798b may be formed. That is, in this embodiment, two electrode extensions 798b are formed, without being limited thereto. Alternatively, only one electrode extension or three or more electrode extensions 798b may be provided.

Then, the process of separating the support substrate 780 is performed, thereby providing a plurality of light emitting diode chips, as shown in FIG. 36.

Although some embodiments have been described herein, it should be understood by those skilled in the art that these embodiments are given by way of illustration only, and that various modifications, variations, and alterations can be made without departing from the spirit and scope of the invention.

The invention claimed is:

1. A method of separating a growth substrate from an epitaxial layer, comprising:
preparing a growth substrate;
forming a convex-concave pattern comprising a plurality of convex portions and concave portions on one surface of the growth substrate;
epitaxially growing a sacrificial layer on the convex portions of the convex-concave pattern;
forming a plurality of fine pores by performing electro chemical etching (ECE) on the sacrificial layer;
epitaxially growing a plurality of semiconductor layers on the sacrificial layer;
attaching a support substrate to the semiconductor layers; and
separating the growth substrate,
wherein a plurality of voids are formed by merging or growing the fine pores within the sacrificial layer after the semiconductor layers are epitaxially grown on the sacrificial layer.

2. The method according to claim 1, further comprising: forming a growth control layer on the concave portions of the convex-concave pattern before epitaxial growth of the sacrificial layer.

3. The method according to claim 1, wherein the concave portions comprise trapezoidal grooves, a cross-section of which has a narrow bottom side and a wide top side.

4. The method according to claim 1, wherein the concave portions have a V-shaped cross-section.

5. The method according to claim 1, wherein epitaxially growing of the sacrificial layer comprises epitaxially growing the sacrificial layer from each of the convex portions.

6. The method according to claim 1, wherein separating the growth substrate comprises applying stress to the sacrificial layer.

7. The method according to claim 1, wherein separating the growth substrate comprises injecting an etching liquid for etching the sacrificial layer into the concave portions of the convex-concave pattern.

8. A method of separating a growth substrate from an epitaxial layer, comprising:
preparing a growth substrate;
forming a convex-concave pattern comprising a plurality of convex portions and concave portions on one surface of the growth substrate;

epitaxially growing a sacrificial layer on the convex portions of the convex-concave pattern;

forming a mask pattern on the sacrificial layer such that open regions can be formed corresponding to the concave portions of the convex-concave pattern;

epitaxially growing a plurality of semiconductor layers over the mask pattern from the sacrificial layer exposed through the open regions;

etching at least a portion of the sacrificial layer exposed through the concave portions and a portion of the semiconductor layer formed in the open regions of the mask pattern by injecting an etching liquid for etching the sacrificial layer into the concave portions of the convex-concave pattern; and separating the semiconductor layers from the growth substrate.

9. The method according to claim 8, further comprising: forming a growth control layer on the concave portions of the convex-concave pattern before epitaxial growth of the sacrificial layer.

10. The method according to claim 8, further comprising: attaching a support substrate to the semiconductor layers before separating the semiconductor layers.

11. The method according to claim 8, wherein separating the semiconductor layers from the growth substrate comprises etching the mask pattern by injecting an etching liquid for etching the mask pattern into the concave portions of the convex-concave pattern.

12. The method according to claim 8, wherein the concave portions comprise trapezoidal grooves, a cross-section of which has a narrow bottom side and a wide top side.

13. The method according to claim 8, wherein the concave portions have a V-shaped cross-section.

14. The method according to claim 8, wherein epitaxially growing of the sacrificial layer comprises epitaxially growing the sacrificial layer from each of the convex portions.

15. A method of separating a growth substrate from an epitaxial layer, comprising:

preparing a growth substrate;

growing a sacrificial layer on one surface of the growth substrate;

forming a plurality of fine pores within the sacrificial layer;

forming a plurality of cavities from the plurality of fine pores;

separating the growth substrate using the plurality of cavities; and wherein the plurality of fine pores are formed by applying voltages of at least two levels, voltage applied initially having a lower level than voltage applied later.

16. The method according to claim 15, further comprising: forming an insulation pattern on a surface of the sacrificial layer before or after forming the plurality of fine pores.

17. The method according to claim 15, wherein forming the plurality of cavities from the plurality of fine pores comprises:

growing a plurality of nitride semiconductor layers on the sacrificial layer; and forming the plurality of cavities from the plurality of fine pores while growing the nitride semiconductor layers.

18. The method according to claim 15, wherein preparing the growth substrate comprises forming a stripe pattern on one surface of the growth substrate.

19. The method according to claim 18, wherein the stripe pattern is formed by etching one surface of the growth substrate through dry etching or wet etching.

20. The method according to claim 19, wherein the forming the stripe pattern comprises forming a growth control layer on a bottom surface of the stripe pattern after the stripe pattern is formed on one surface of the growth substrate by dry etching one surface of the growth substrate.

21. The method according to claim 18, wherein, when the growth substrate is a sapphire substrate, the stripe pattern is formed in a direction from 60 to 90 degrees with respect to the sapphire substrate, and when the growth substrate is a GaN substrate, the stripe pattern is formed in a direction of 60 degrees with respect to the GaN substrate.

22. The method according to claim 15, wherein the sacrificial layer comprises n-GaN.

23. The method according to claim 22, wherein the sacrificial layer comprises at least two layers having different concentrations of n-type impurities.

24. The method according to claim 15, wherein the plurality of fine pores are formed by electro chemical etching (ECE).

25. The method according to claim 15, wherein separating the growth substrate using the plurality of cavities comprises:

forming nitride semiconductor layers on the sacrificial layer;

attaching the support substrate to the nitride semiconductor layers; and separating the growth substrate and the nitride semiconductor layers by applying mechanical stress to the sacrificial layer.

26. A method of separating a growth substrate from an epitaxial layer, comprising:

preparing a growth substrate;

growing a sacrificial layer on one surface of the growth substrate;

forming a plurality of file pores within the sacrificial layer;

forming a plurality of cavities from the plurality of fine pores;

separating the growth substrate using the plurality of cavities;

wherein separating the growth substrate using the plurality of cavities comprises:

forming nitride semiconductor layers on the sacrificial layer;

forming a mesa line connected to at least the cavities by mesa etching the nitride semiconductor layers and the sacrificial layer;

attaching the support substrate to the nitride semiconductor layers; and separating the growth substrate from the nitride semiconductor layers by injecting an etching liquid into the mesa line to etch the sacrificial layer.

27. The method according to claim 26, wherein the growth substrate comprises a stripe pattern on one surface thereof and the mesa line is connected to the stripe pattern.

28. The method according to claim 27, wherein the mesa line is formed so as not to be parallel to the stripe pattern such that the mesa line and the stripe pattern intersect each other.

29. The method according to claim 25, further comprising:

removing the insulation pattern after separating the growth substrate from the nitride semiconductor layers.

30. The method according to claim 26, further comprising:

removing the insulation pattern after separating the growth substrate from the nitride semiconductor layers.

* * * * *